US012804905B2

(12) United States Patent
Yun et al.

(10) Patent No.: US 12,804,905 B2
(45) Date of Patent: Nov. 17, 2026

(54) SEMICONDUCTOR DEVICES INCLUDING GATE ELECTRODES WITH DIFFERENT THICKNESSES AND ELECTRONIC SYSTEMS INCLUDING THE SAME

(71) Applicant: Samsung Electronics Co., Ltd., Suwon-si (KR)

(72) Inventors: Youngshik Yun, Suwon-si (KR); Dongsik Lee, Suwon-si (KR); Siwan Kim, Suwon-si (KR); Sori Lee, Suwon-si (KR); Bongtae Park, Suwon-si (KR); Jaejoo Shim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 621 days.

(21) Appl. No.: 18/356,324

(22) Filed: Jul. 21, 2023

(65) Prior Publication Data

US 2024/0040792 A1 Feb. 1, 2024

(30) Foreign Application Priority Data

Jul. 27, 2022 (KR) ........................ 10-2022-0093049

(51) Int. Cl.
*H10B 43/40* (2023.01)
*G11C 16/04* (2006.01)
(Continued)

(52) U.S. Cl.
CPC ......... *H10B 43/40* (2023.02); *G11C 16/0483* (2013.01); *H10B 41/27* (2023.02);
(Continued)

(58) Field of Classification Search
CPC ........ H10B 43/40; H10B 41/27; H10B 41/35; H10B 41/40; H10B 43/27; H10B 43/35;
(Continued)

(56) References Cited

U.S. PATENT DOCUMENTS

| | | | |
|---|---|---|---|
| 8,084,805 | B2 | 12/2011 | Shim et al. |
| 8,587,052 | B2 | 11/2013 | Yun et al. |

(Continued)

FOREIGN PATENT DOCUMENTS

| | | | |
|---|---|---|---|
| JP | 2005167093 A | 6/2005 | |
| KR | 10-2010-0036520 A | 4/2010 | |
| KR | 10-2016-0133626 A | 11/2016 | |

*Primary Examiner* — Mounir S Amer
*Assistant Examiner* — Nicholas B Michaud
(74) *Attorney, Agent, or Firm* — Wolf, Greenfield & Sacks, P.C.

(57) ABSTRACT

A semiconductor device includes a peripheral circuit region and a memory cell region. The memory cell region may include a stack structure including gate electrodes and interlayer insulating layers repeatedly and alternately stacked in a vertical direction, and a channel structure penetrating through the stack structure. The gate electrodes may include first gate electrodes, second gate electrodes on the first gate electrodes, and third gate electrodes on the second gate electrodes. Each of the first gate electrodes may have a first thickness. Each of the second gate electrodes may have a second thickness that is greater than the first thickness. Each of the third gate electrodes may have a third thickness that is smaller than the second thickness.

19 Claims, 19 Drawing Sheets

(51) Int. Cl.

| | |
|---|---|
| ***H10B 41/27*** | (2023.01) |
| ***H10B 41/35*** | (2023.01) |
| ***H10B 41/40*** | (2023.01) |
| ***H10B 43/27*** | (2023.01) |
| ***H10B 43/35*** | (2023.01) |
| ***H10B 80/00*** | (2026.01) |
| ***H10W 20/41*** | (2026.01) |
| ***H10W 90/00*** | (2026.01) |
| *H10W 90/20* | (2026.01) |

(52) U.S. Cl.
CPC ............. *H10B 41/35* (2023.02); *H10B 41/40* (2023.02); *H10B 43/27* (2023.02); *H10B 43/35* (2023.02); *H10B 80/00* (2023.02); *H10W 20/435* (2026.01); *H10W 90/00* (2026.01); *H10W 90/297* (2026.01)

(58) Field of Classification Search
CPC ........ H10B 80/00; H10B 43/50; H10B 41/30; H10B 43/30; H10B 41/50; G11C 16/0483; G11C 5/025; H10W 20/435; H10W 90/00; H10W 90/297; H01L 25/18
USPC .......................................................... 257/314
See application file for complete search history.

(56) References Cited

U.S. PATENT DOCUMENTS

| | | | | |
|---|---|---|---|---|
| 9,437,483 | B2 | 9/2016 | Lee et al. | |
| 2005/0151228 | A1 | 7/2005 | Tanida et al. | |
| 2010/0078701 | A1* | 4/2010 | Shim ...................... | H10B 41/30<br>257/314 |
| 2012/0164821 | A1 | 6/2012 | Kim et al. | |
| 2013/0032875 | A1* | 2/2013 | Yun ........................ | H10B 43/50<br>257/314 |
| 2013/0193395 | A1* | 8/2013 | Lee ...................... | H10B 63/845<br>257/4 |
| 2015/0200202 | A1 | 7/2015 | Karda et al. | |
| 2015/0249092 | A1 | 9/2015 | Sakui et al. | |
| 2020/0312874 | A1 | 10/2020 | Kang et al. | |
| 2020/0388626 | A1* | 12/2020 | Baraskar .............. | H10D 62/151 |
| 2020/0411544 | A1* | 12/2020 | Wang ..................... | H10B 43/27 |

* cited by examiner

100

| GATE ELECTRODE | THICKNESS OF GATE ELECTRODE | INTERLAYER INSULATING LAYER | THICKNESS OF INTERLAYER INSULATING LAYER |
|---|---|---|---|
| 130M5 | Lg5=X | 120M5 | Ls5=Y |
| 130M4 | Lg4=X+a1 | 120M4 | Ls4=Y |
| 130M3 | Lg3=X | 120M3 | Ls3=Y |
| 130M2 | Lg2=X | 120M2 | Ls2=Y+b1 |
| 130M1 | Lg1=X | 120M1 | Ls1=Y+b2 |

X>0, Y>0, a1>0, b1>0, b2>0

FIG. 2B

100a

| GATE ELECTRODE | THICKNESS OF GATE ELECTRODE | INTERLAYER INSULATING LAYER | THICKNESS OF INTERLAYER INSULATING LAYER |
|---|---|---|---|
| 130M5 | Lg5a=X+a2 | 120M5 | Ls5a=Y |
| 130M4 | Lg4a=X+a1 | 120M4 | Ls4a=Y |
| 130M3 | Lg3a=X | 120M3 | Ls3a=Y |
| 130M2 | Lg2a=X | 120M2 | Ls2a=Y+b1 |
| 130M1 | Lg1a=X | 120M1 | Ls1a=Y |

X>0, Y>0, a1>0, a2>0, b1>0

FIG. 4B

100b

| GATE ELECTRODE | THICKNESS OF GATE ELECTRODE | INTERLAYER INSULATING LAYER | THICKNESS OF INTERLAYER INSULATING LAYER |
|---|---|---|---|
| 130M5 | Lg5b=X+a2 | 120M5 | Ls5b=Y |
| 130M4 | Lg4b=X+a1 | 120M4 | Ls4b=Y |
| 130M3 | Lg3b=X | 120M3 | Ls3b=Y |
| 130M2 | Lg2b=X | 120M2 | Ls2b=Y+b1 |
| 130M1 | Lg1b=X | 120M1 | Ls1b=Y+b2 |

X>0, Y>0, a1>0, a2>0, b1>0, b2>0

FIG. 5B

SEMICONDUCTOR DEVICES INCLUDING GATE ELECTRODES WITH DIFFERENT THICKNESSES AND ELECTRONIC SYSTEMS INCLUDING THE SAME

CROSS-REFERENCE TO RELATED APPLICATION(S)

This application claims benefit of priority to Korean Patent Application No. 10-2022-0093049 filed on Jul. 27, 2022, in the Korean Intellectual Property Office, and the entire contents of the above-identified application are incorporated by reference herein.

TECHNICAL FIELD

Aspects of the present disclosure relate to semiconductor devices and to electronic systems including the semiconductor devices.

BACKGROUND

Semiconductor devices configured to store high-capacity data for use in electronic systems that requiring data storage have become increasingly desired. Accordingly, methods for increasing data storage capacity of semiconductor devices have been researched. For example, one proposed method for increasing data storage capacity of a semiconductor device includes arranging memory cells three-dimensionally, instead of two-dimensionally.

SUMMARY

Some example embodiments provide semiconductor devices having improved electrical properties and improved reliability.

Some example embodiments provide electronic system including semiconductor devices having improved electrical properties and improved reliability.

According to some example embodiments, a semiconductor device may include a peripheral circuit region including a first substrate, circuit devices on the first substrate, and a first interconnection structure electrically connected to the circuit devices; and a memory cell region that overlaps the peripheral circuit region. The memory cell region may include a second substrate, a stack of gate electrodes and interlayer insulating layers stacked in a vertical direction perpendicular to an upper surface of the second substrate, and a channel structure that extends through the stack and includes a channel layer. The gate electrodes may include first gate electrodes, second gate electrodes on the first gate electrodes, third gate electrodes on the second gate electrodes, fourth gate electrodes on the third gate electrodes, and fifth gate electrodes on the fourth gate electrodes. The interlayer insulating layers may include first interlayer insulating layers, second interlayer insulating layers on the first interlayer insulating layers, third interlayer insulating layers on the second interlayer insulating layers, fourth interlayer insulating layers on the third interlayer insulating layers, and fifth interlayer insulating layers on the fourth interlayer insulating layers. Each of the fourth gate electrodes may have a thickness that is greater than a thickness of each of the third gate electrodes. Each of the second interlayer insulating layers may have a thickness that is greater than thickness of each of the third interlayer insulating layers.

According to some example embodiments, a semiconductor device may include a stack structure including gate electrodes and interlayer insulating layers repeatedly and alternately stacked in a vertical direction; and a channel structure that extends through the stack structure. The gate electrodes may include first gate electrodes, second gate electrodes on the first gate electrodes, and third gate electrodes on the second gate electrodes. Each of the first gate electrodes has a first thickness. Each of the second gate electrodes may have a second thickness that is greater than the first thickness. Each of the third gate electrodes may have a third thickness that is smaller than the second thickness.

According to some example embodiments, an electronic system may include a semiconductor device including a peripheral circuit region including a first substrate, circuit devices on the first substrate, and a first interconnection structure electrically connected to the circuit devices; and a memory cell region that overlaps the peripheral circuit region; input/output pads electrically connected to the circuit devices; and a controller electrically connected to the semiconductor device through the input/output pad and controlling the semiconductor device. The memory cell region may include gate electrodes stacked and spaced apart from each other in a first direction perpendicular to an upper surface of the second substrate on the first region, interlayer insulating layers alternately stacked with the gate electrodes, and a channel structure penetrating the gate electrodes, that extends perpendicularly to the second substrate and includes a channel layer. The gate electrodes may include first gate electrodes, second gate electrodes on the first gate electrodes, third gate electrodes on the second gate electrodes, fourth gate electrodes on the third gate electrodes, and fifth gate electrodes on the fourth gate electrodes. The interlayer insulating layers may include first interlayer insulating layers, second interlayer insulating layers on the first interlayer insulating layers, third interlayer insulating layers on the second interlayer insulating layers, fourth interlayer insulating layers on the third interlayer insulating layers, and fifth interlayer insulating layers on the fourth interlayer insulating layers. Each of the fourth gate electrodes may have a thickness greater than a thickness of each of the third gate electrodes, and each of the second interlayer insulating layers may have a thickness that is greater than thickness of each of the third interlayer insulating layers.

BRIEF DESCRIPTION OF THE DRAWINGS

The above and other aspects, features, and advantages of the present disclosure will be more clearly understood from the following detailed description, taken in combination with the accompanying drawings, in which:

FIG. 2B is a table relating to a semiconductor device according to some example embodiments;

FIG. 4B is a table relating to a semiconductor device according to some example embodiments;

FIG. 5B is a table relating to a semiconductor device according to some example embodiments;

DETAILED DESCRIPTION

Hereinafter, some examples of embodiments of the inventive concepts provided by the present disclosure will be described as follows with reference to the accompanying drawings. Hereinafter, terms such as "upper portion," "middle portion," and "lower portion" may be replaced with other terms, for example, "first," "second," and "third" to describe elements of the specification. Terms such as "first," "second," and "third" may be used to describe different elements, but the elements are not limited by the terms, and a "first element" may be referred to as a "second element."

Figure 1A:
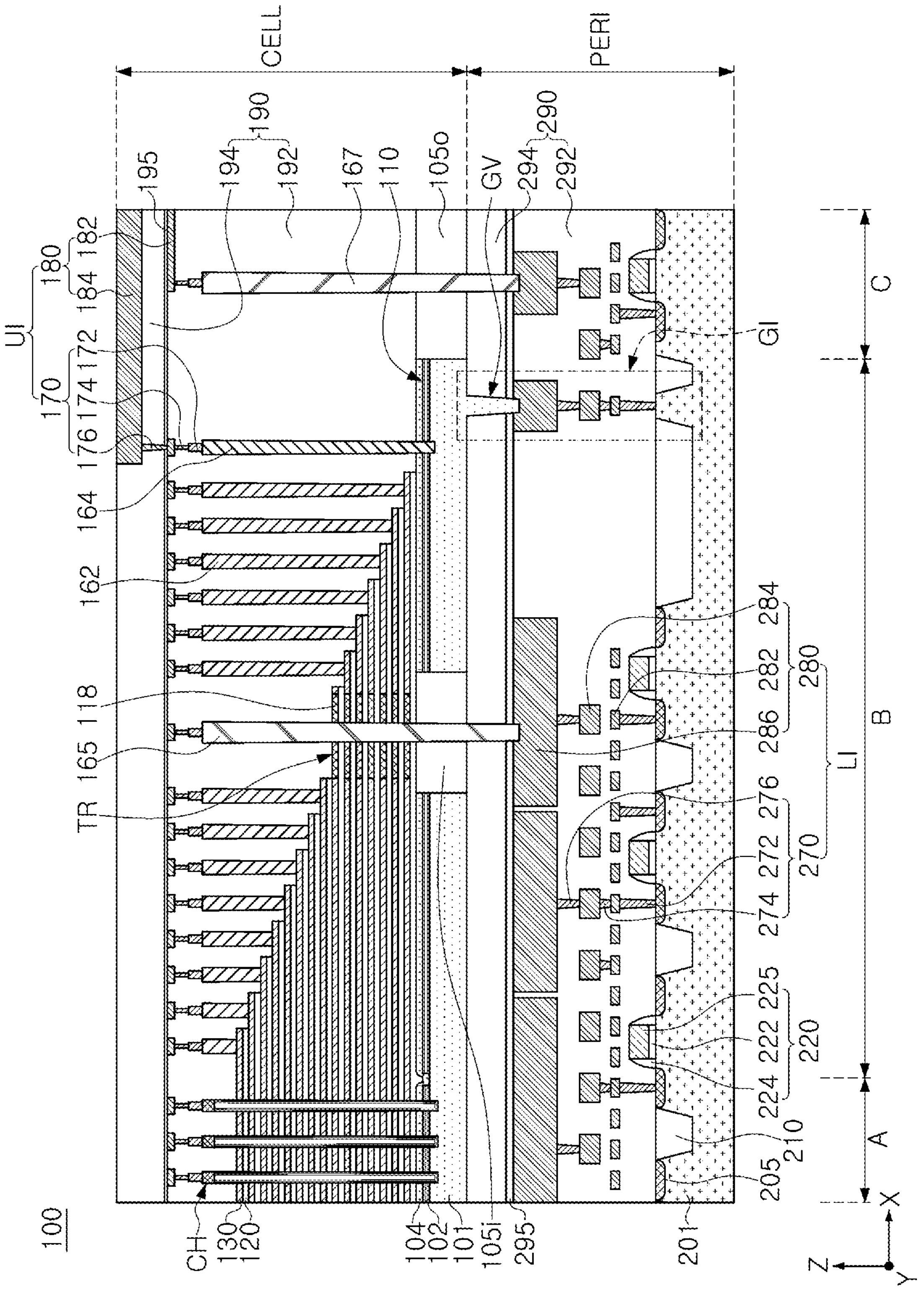
FIG. 1A is a cross-sectional diagram illustrating a semiconductor device according to some example embodiments.
Figure 1B:
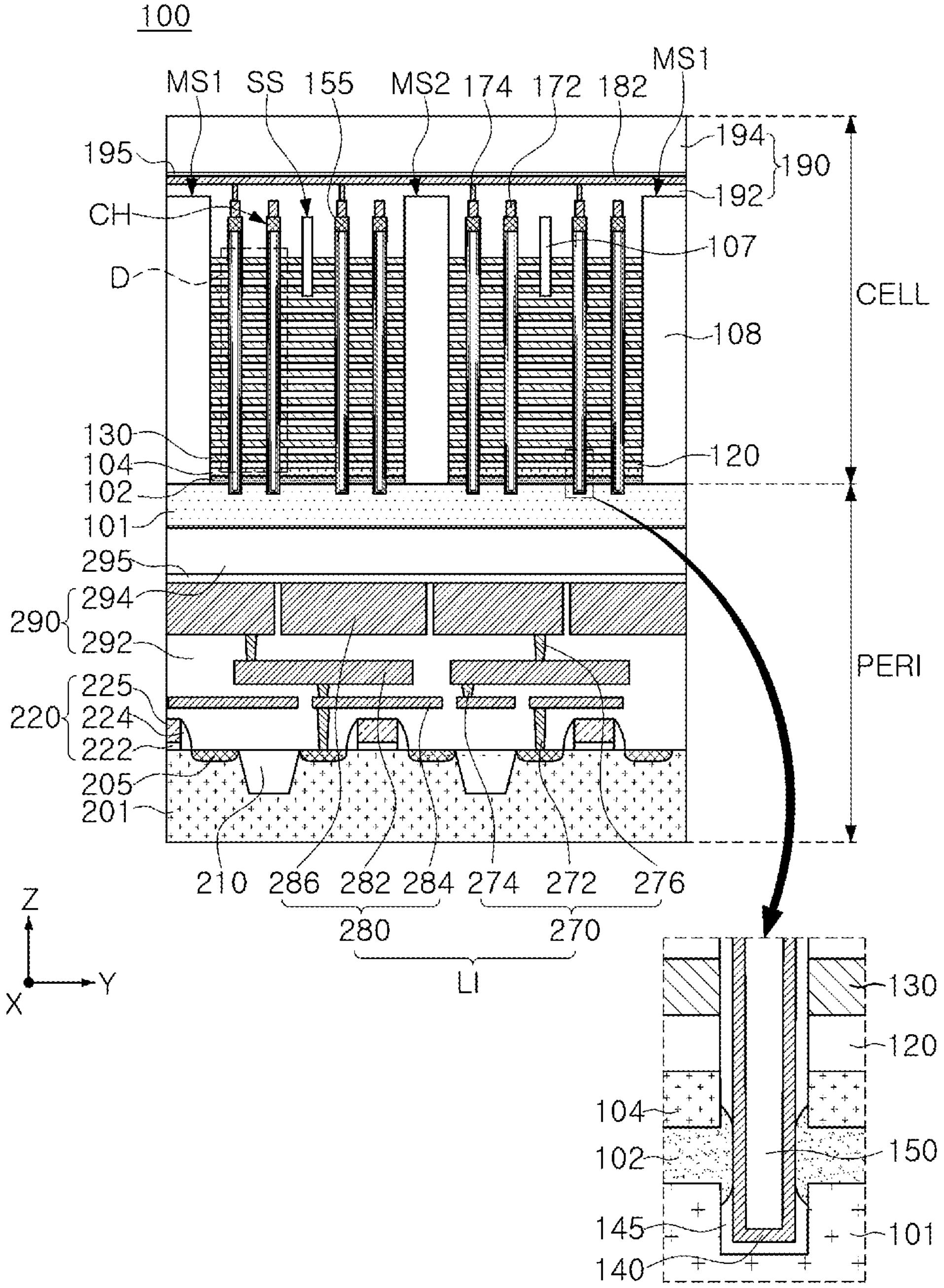
FIG. 1B is a cross-sectional diagram illustrating a semiconductor device according to some example embodiments.
Figure 2A:
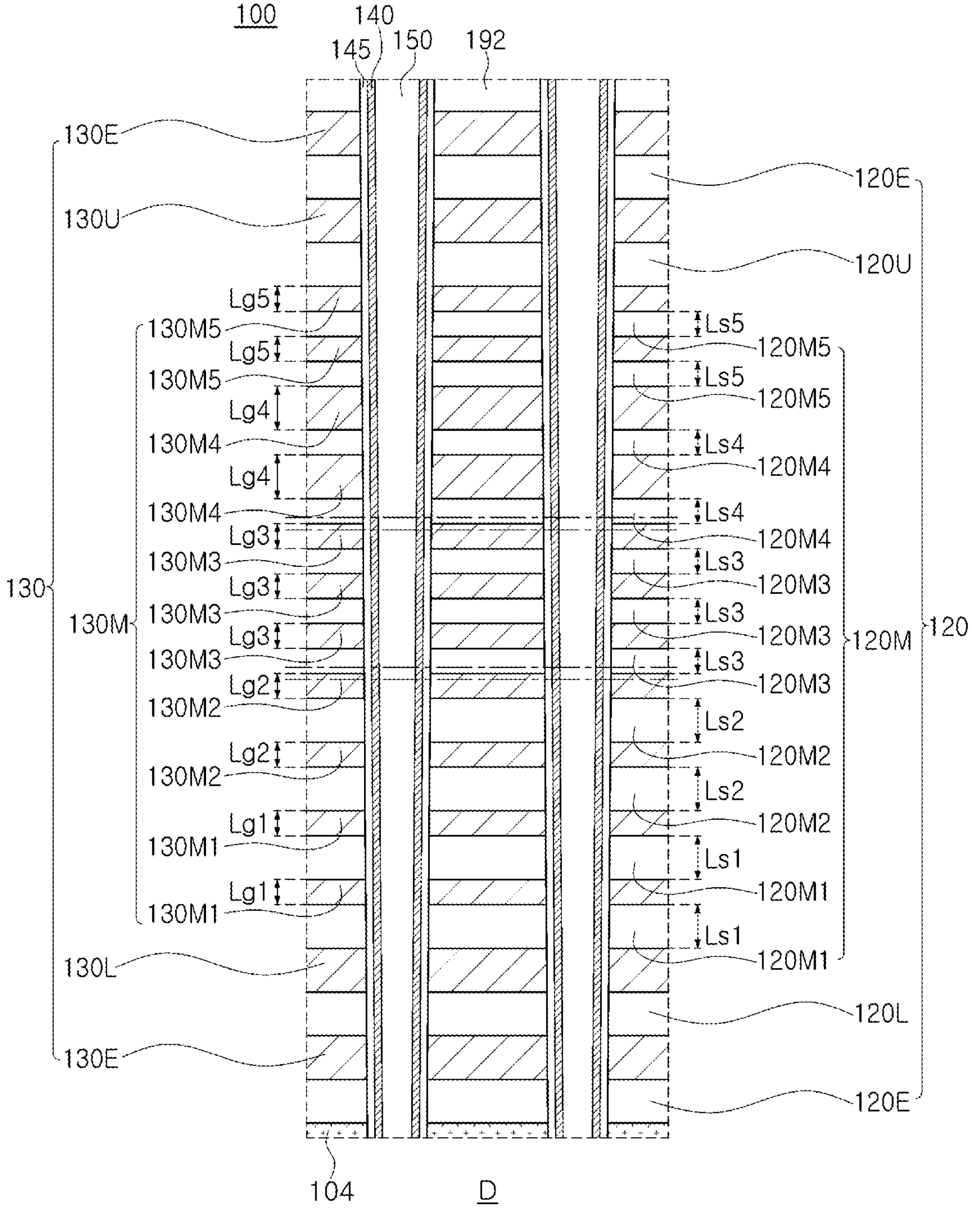
FIG. 2A is an enlarged diagram illustrating a portion of a semiconductor device according to some example embodiments.
Figure 3:
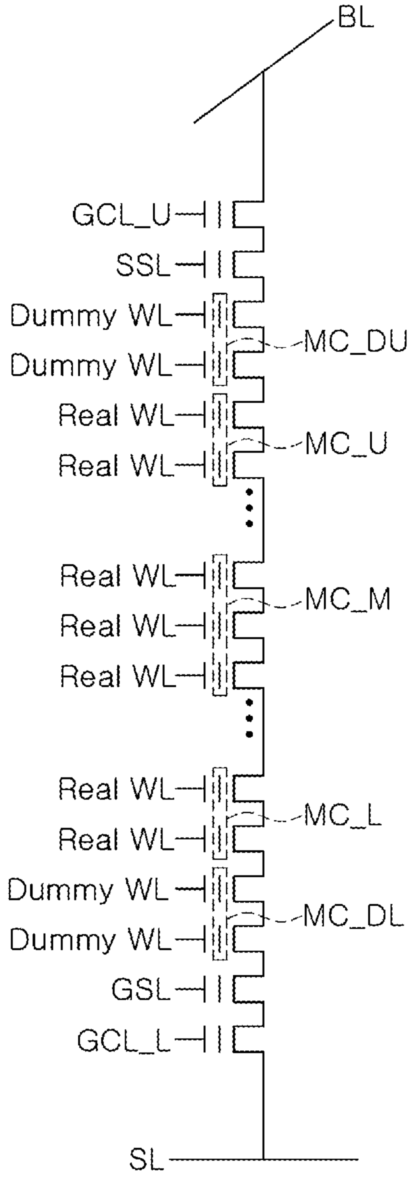
FIG. 3 is a circuit diagram illustrating a semiconductor device according to some example embodiments.

FIGS. 1A and 1B are cross-sectional diagrams illustrating a semiconductor device according to some example embodiments. FIG. 2A is an enlarged diagram illustrating a portion of a semiconductor device according to some example embodiments, and specifically illustrates region "D" in FIG. 1B. FIG. 2B is a table relating to a semiconductor device according to some example embodiments. FIG. 3 is a circuit diagram illustrating a semiconductor device according to some example embodiments.

FIGS. 1A to 3, a semiconductor device 100 may include a peripheral circuit region PERI including a first substrate 201, a memory cell region CELL including a second substrate 101, a through interconnection region TR including a first through-via 165 electrically connecting the peripheral circuit region PERI to the memory cell region CELL, and a ground interconnection structure GI connecting the first substrate 201 to the second substrate 101. The memory cell region CELL may overlap the peripheral circuit region PERI in a vertical direction or a Z-direction. The memory cell region CELL may be on the peripheral circuit region PERI. Alternatively, according to some example embodiments, the cell region CELL may be below the peripheral circuit region PERI. The through interconnection region TR may extend from the memory cell region CELL to the peripheral circuit region PERI. The ground interconnection structure GI may extend from a lower region of the memory cell region CELL to the peripheral circuit region PERI.

The peripheral circuit region PERI may include the first substrate 201, source/drain regions 205 and device isolation layers 210 in the first substrate 201, circuit devices 220 on the first substrate 201, a peripheral region insulating layer 290, a lower protective layer 295, and a first interconnection structure LI.

The first substrate 201 may have an upper surface extending in first and second horizontal directions, e.g., a X-direction and a Y-direction. An active region may be defined in the first substrate 201 by the device isolation layers 210. The source/drain regions 205 may include impurities, and may be in a portion of the active region. The first substrate 201 may include a semiconductor material, such as, for example, a group IV semiconductor, a group III-V compound semiconductor, or a group II-VI compound semiconductor. The first substrate 201 may be provided as a bulk wafer or an epitaxial layer.

The circuit devices 220 may include a planar transistor. Each of the circuit devices 220 may include a circuit gate dielectric layer 222, a spacer layer 224, and a circuit gate electrode 225. The source/drain regions 205 may be in the first substrate 201 on first and second sides of the circuit gate electrode 225 (e.g., in the first horizontal direction).

The peripheral region insulating layer 290 may be on the circuit device 220 on the first substrate 201. The peripheral region insulating layer 290 may include first and second peripheral region insulating layers 292 and 294, and each of the first and second peripheral region insulating layers 292 and 294 may also include a plurality of insulating layers. The peripheral region insulating layer 290 may be formed of an insulating material.

The lower protective layer 295 may be on the upper surface of the third lower interconnection lines 286 (discussed further below) between the first and second peripheral region insulating layers 292 and 294. In example embodiments, the lower protective layer 295 may be on the upper surfaces of the first and second lower interconnection lines 282 and 284 (discussed further below). The lower protective layer 295 may be provided to prevent contamination of the lower interconnection lines 280 by a metal material provided therebelow. The lower protective layer 295 may be formed of an insulating material different from that of the peripheral region insulating layer 290, and may include, for example, silicon nitride.

The first interconnection structure LI may be an interconnection structure electrically connected to the circuit devices 220 and the source/drain regions 205. The first interconnection structure LI may include lower contact plugs 270 having a column shape and lower interconnection lines 280 having a line shape. The lower contact plugs 270 may include first to third lower contact plugs 272, 274, and 276. The first lower contact plugs 272 may be on the circuit devices 220 and the source/drain regions 205, the second lower contact plugs 274 may be on the first lower interconnection lines 282, and the third lower contact plugs 276 may be on the second lower interconnection lines 284. The lower interconnection lines 280 may include first to third lower interconnection lines 282, 284, and 286. The first lower interconnection lines 282 may be on the first lower contact plugs 272, the second lower interconnection lines 284 may be on the second lower contact plugs 274, and the third lower interconnection lines 286 may be on the third lower contact plugs 276. The first interconnection structure LI may include a conductive material, such as, for example, tungsten (W), copper (Cu), aluminum (Al), and the like, and each element may further include a diffusion barrier layer. In some example embodiments, the number of layers and the arrangement of the lower contact plugs 270 and the lower interconnection lines 280 included in the first interconnection structure LI may be varied.

The memory cell region CELL may include a second substrate 101 having a first region A and a second region B, first and second horizontal conductive layers 102 and 104 on the second substrate 101, gate electrodes 130 stacked on the second substrate 101, and first and second separation regions MS1 and MS2 which may extend through a stack structure that includes the gate electrodes 130. The memory cell region CELL may also include upper separation regions SS which may extend through a portion of the stack structure, channel structures CH that may extend through the stack structure, and a second interconnection structure UI electrically connected to the channel structures CH. The memory cell region CELL may further include substrate insulating layers 105*i* and 105*o*, interlayer insulating layers 120 alternately stacked with gate electrodes 130 on the second substrate 101, gate contacts 162 connected to the gate electrodes 130, a substrate contact 164 connected to the second substrate 101, a cell region insulating layer 190 covering the gate electrodes 130, and an upper protective layer 195. The memory cell region CELL may further include a third region C on an external side of the second substrate 101, and a through interconnection structure such as a second through-via 167 connecting the memory cell region CELL to the peripheral circuit region PERI in the third region C. The stack structure may include the gate electrodes 130 and the interlayer insulating layers 120 repeatedly and alternately stacked in the Z-direction.

The gate electrodes 130 may be vertically stacked and the channel structures CH may be in the first region A of the second substrate 101, and in the second region B, the gate electrodes 130 may extend to have different lengths, and the second region B may electrically connect the memory cells to the peripheral circuit region PERI. The second region B may be on at least one end of the first region A in at least one direction, that is, for example, the X-direction.

The second substrate 101 may have an upper surface extending in the X-direction and the Y-direction. The second substrate 101 may include a semiconductor material, such as, for example, a group IV semiconductor, a group III-V compound semiconductor, or a group II-VI compound semiconductor. For example, the group IV semiconductor may include silicon, germanium, or silicon-germanium. The second substrate 101 may further include impurities. The second substrate 101 may be provided as a polycrystalline semiconductor layer such as a polycrystalline silicon layer or an epitaxial layer. The second substrate 101 may have a substantially planar upper surface and a non-planar lower surface protruding by the upper via GV.

The first and second horizontal conductive layers 102 and 104 may be stacked on the upper surface of the second substrate 101. At least a portion of the first and second horizontal conductive layers 102 and 104 may function as a portion of a common source line of the semiconductor device 100, that is, for example, as a common source line together with the second substrate 101. As illustrated in the enlarged diagram in FIG. 1B, the first horizontal conductive layer 102 may be directly connected to the channel layer 140 around the channel layer 140. The first and second horizontal conductive layers 102 and 104 may include a semiconductor material, such as polycrystalline silicon. In some embodiments, at least the first horizontal conductive layer 102 may be a doped layer, and the second horizontal conductive layer 104 may be a doped layer or a layer containing impurities diffused from the first horizontal conductive layer 102.

The horizontal insulating layer 110 may be on the second substrate 101 in parallel to the first horizontal conductive layer 102 in at least a portion of the second region B. The horizontal insulating layer 110 may be layers remaining after a portion of the horizontal insulating layer 110 is replaced with the first horizontal conductive layer 102 in a process of manufacturing the semiconductor device 100. The horizontal insulating layer 110 may include silicon oxide, silicon nitride, silicon carbide, or silicon oxynitride. In some embodiments, the horizontal insulating layer 110 may include first to third horizontal insulating layers stacked in order, the first and third horizontal insulating layers may be silicon oxide layers, and the second horizontal insulating layer may be silicon nitride layers.

The substrate insulating layers 105*i* and 105*o* may be in a region from which a portion of the second substrate 101, the first and second horizontal conductive layers 102 and 104, and the horizontal insulating layer 110 are removed, and may be in contact with side surfaces of the second substrate 101, the first and second horizontal conductive layers 102 and 104, and the horizontal insulating layer 110. The lower surfaces of the substrate insulating layers 105*i* and 105*o* may be coplanar with the lower surface of the second substrate 101 or may be on a level lower than a level of the lower surface of the second substrate 101. The substrate insulating layers 105*i* and 105*o* may be formed of an insulating material, and may include, for example, silicon oxide, silicon oxynitride, or silicon nitride.

The gate electrodes 130 may be vertically stacked and spaced apart from each other on the second substrate 101 and may form a stack structure. As seen in FIG. 2A, the gate electrodes 130 may include a ground select gate electrode 130L forming a ground select transistor, a memory cell gate electrode 130M forming memory cells, and a string select gate electrode 130U forming a string select transistor, in order from the second substrate 101. In some example embodiments, each of the ground selection gate electrode 130L and the string selection gate electrode 130U may include one gate electrode or two or more gate electrodes, and may have a structure the same as or different from the memory cell gate electrode 130M. The number of memory cell gate electrodes 130M may be determined depending on capacity of the semiconductor device 100. The memory cell gate electrode 130M may include first gate electrodes 130M1, second gate electrodes 130M2 on the first gate electrodes 130M1, third gate electrodes 130M3 on the second gate electrodes 130M2, fourth gate electrodes 130M4 on the third gate electrodes 130M3, and fifth gate electrodes 130M5 on the fourth gate electrodes 130M4. Also, the gate electrodes 130 may further include an erase gate electrode 130E on or above the string select gate electrode 130U or below the ground select gate electrode 130L and included in an erase transistor used in an erase operation using a gate induced drain leakage (GIDL) phenomenon. A portion of the gate electrodes 130, that is, for example, the gate electrodes 130 adjacent to the string select gate electrode 130U and the ground select gate electrode 130L, may be dummy gate electrodes.

Each of the first to fifth gate electrodes 130M1, 130M2, 130M3, 130M4, and 130M5 may have a horizontal area or width, and a size thereof may decrease in a direction away from the second substrate 101. Stated differently, the horizontal area or width of each of the first to fifth gate electrodes 130M1, 130M2, 130M3, 130M4, and 130M5 may decrease as a distance from the second substrate 101 increases. This may be because a size of the horizontal area of the channel structures CH surrounded by the first to fifth gate electrodes 130M1, 130M2, 130M3, 130M4 and 130M5 may increase in a direction away from the second substrate 101 (or stated differently, the horizontal area or width of the channel structure may increase as a distance from the second substrate 101 increases). A resistance value of each of the first to fifth gate electrodes 130M1, 130M2, 130M3, 130M4, and 130M5 may increase in a direction away from the second substrate 101. This may be because a size of the horizontal area of each of the first to fifth gate electrodes

130M1, 130M2, 130M3, 130M4, and 130M5 decreases in a direction away from the second substrate 101. In some example embodiments, the thickness of each of the first to fifth gate electrodes 130M1, 130M2, 130M3, 130M4, and 130M5 may vary. For example, each of the fourth gate electrodes 130M4 may have a thickness greater than that of each of the first, second, third, and fifth gate electrodes 130M1, 130M2, 130M3, and 130M5. For example, each of the fourth gate electrodes 130M4 may have a thickness of about 1.005 times to about 1.1 times greater than that of each of the first, second, third, and fifth gate electrodes 130M1, 130M2, 130M3, and 130M5. This may result in each of the fourth gate electrodes 130M4 having a lower resistance value, for example because the thickness of each of the fourth gate electrodes 130M4 may be increased. However, the thickness of each of the fifth gate electrodes 130M5 may not be increased, and each of the fifth gate electrodes 130M5 may have substantially the same thickness as that of each of the first to third gate electrodes 130M1, 130M2, and 130M3. This may prevent the overall thickness of the first to fifth gate electrodes 130M1, 130M2, 130M3, 130M4 and 130M5 from excessively increasing. Also, the length in which each of the fourth gate electrodes 130M4 overlaps the channel structures CH in the vertical direction may be greater than the length in which each of the first, second, third, and fifth gate electrodes 130M1, 130M2, 130M3, and 130M5 overlaps the channel structures CH in the vertical direction. Also, the area in which each of the fourth gate electrodes 130M4 surrounds the channel structures CH may be greater than the area in which each of the first, second, third, and fifth gate electrodes 130M1, 130M2, 130M3, and 130M5 surrounds the channel structures CH. Each of the string select gate electrode, the ground select gate electrode, and the erase gate electrode may have a thickness greater than that of each of the first, second, third, and fifth gate electrodes 130M1, 130M2, 130M3, and 130M5. The first, second, third, and fifth gate electrodes 130M1, 130M2, 130M3, and 130M5 may have substantially the same thickness.

The gate electrodes 130 may be vertically stacked and spaced apart from each other on the first region A, may extend from the first region A to the second region B by different lengths, and may form a step structure in a staircase shape. As illustrated in FIG. 1A, the gate electrodes 130 may form a step structure in the X-direction. In example embodiments, a predetermined number of the gate electrodes 130, that is, for example, two to six gate electrodes 130, may form a gate group, and the gate groups may form a step structure in the X-direction. In some embodiments, the gate electrodes 130 included in the gate group may have a step structure in the Y-direction as well. Due to the step structure, the gate electrodes 130 may form a staircase shape in which the lower gate electrode 130 extends longer than the upper gate electrode 130, and may provide ends exposed upwardly from the interlayer insulating layers 120. In some example embodiments, the gate electrodes 130 may have an increased thickness on the ends.

The gate electrodes 130 may include a metal material, such as, for example, tungsten (W). In example embodiments, the gate electrodes 130 may include polycrystalline silicon or a metal silicide material. In some example embodiments, the gate electrodes 130 may further include a diffusion barrier layer, and for example, the diffusion barrier layer may include tungsten nitride (WN), tantalum nitride (TaN), titanium nitride (TiN), or a combination thereof.

The interlayer insulating layers 120 may be between the gate electrodes 130. Similarly to the gate electrodes 130, the interlayer insulating layers 120 may be spaced apart from each other in a vertical direction perpendicular to the upper surface of the second substrate 101 and may extend in the X-direction. The interlayer insulating layers 120 may include an insulating material such as silicon oxide or silicon nitride. The interlayer insulating layers 120 may include first interlayer insulating layers 120M1, second interlayer insulating layers 120M2 on the first interlayer insulating layers 120M1, third interlayer insulating layers 120M3 on the second interlayer insulating layers 120M2, fourth interlayer insulating layers 120M4 on the third interlayer insulating layers 120M3, and fifth interlayer insulating layers 120M5 on the fourth interlayer insulating layers 120M4.

In some example embodiments, each of the first and second interlayer insulating layers 120M1 and 120M2 may have a thickness greater than that of each of the third to fifth interlayer insulating layers 120M3, 120M4, and 120M5, and for example, each of the first and second interlayer insulating layers 120M1 and 120M2 may have a thickness of about 1.005 times to about 1.1 times greater than that of each of the third to fifth interlayer insulating layers 120M3, 120M4 and 120M5. This may improve a read window (e.g., a critical read window) of each of the first and second gate electrodes 130M1 and 130M2 in contact with the first and second interlayer insulating layers 120M1 and 120M2, the thickness of each of the first and second interlayer insulating layers 120M1 and 120M2 may be increased. Also, a length in which each of the first and second interlayer insulating layers 120M1 and 120M2 overlaps the channel structures CH in the vertical direction may be greater than a length in which each of the third to fifth interlayer insulating layers 120M3, 120M4, and 120M5 overlaps the channel structures CH in the vertical direction. Also, the area in which each of the first and second interlayer insulating layers 120M1 and 120M2 surrounds the channel structures CH may be greater than the area in which each of the third to fifth interlayer insulating layers 120M3, 120M4 and 120M5 surrounds the channel structures CH. The third to fifth interlayer insulating layers 120M3, 120M4, and 120M5 may have substantially the same thickness.

The first gate electrodes 130M1 and the first interlayer insulating layers 120M1 may be repeatedly and alternately stacked in the Z direction. The second gate electrodes 130M2 and the second interlayer insulating layers 120M2 may be repeatedly and alternately stacked in the Z-direction. The third gate electrodes 130M3 and the third interlayer insulating layers 120M3 may be repeatedly and alternately stacked in the Z-direction. The fourth gate electrodes 130M4 and the fourth interlayer insulating layers 120M4 may be repeatedly and alternately stacked in the Z-direction. The fifth gate electrodes and the fifth interlayer insulating layers may be repeatedly and alternately stacked in the Z-direction.

The first and second separation regions MS1 and MS2 may extend through the stack of gate electrodes 130 and may extend in the X-direction in the first region A and the second region B. The first and second separation regions MS1 and MS2 may be parallel to each other. As illustrated in FIG. 1B, the first and second separation regions MS1 and MS2 may extend through the entire stack of gate electrodes 130 stacked on the second substrate 101 and may be connected to the second substrate 101. The first separation region MS1 may extend as a single region along the first region A and the second region B, and the second separation region MS2 may extend only to a portion of the second region B. In some embodiments, the second separation regions MS2 may be intermittently arranged in the first region A and the second region B. In example embodiments, the arrangement order of the first and second separation regions MS1 and MS2 and the arrangement spacing therebetween may be varied.

The isolation insulating layer 108 may be in the first and second separation regions MS1 and MS2. In example embodiments, the isolation insulating layer 108 may have a shape in which a width may decrease toward the second substrate 101 due to a high aspect ratio. In example embodiments, a conductive layer may be between the isolation insulating layer 108 in the first and second separation regions MS1 and MS2. In this case, the conductive layer may function as a common source line or a contact plug connected to the common source line of the semiconductor device 100.

The upper separation regions SS may extend in the X-direction between the first separation region MS1 and the second separation region MS2. The upper separation regions SS may be in a portion of the second region B and a portion of the first region A and may extend through a portion of the stack of gate electrodes 130. The upper separation regions SS may extend through the uppermost gate electrode 130 among the gate electrodes 130, As illustrated in FIG. 1B, the upper separation regions SS may isolate, for example, three gate electrodes 130 from each other in the Y-direction. In some example embodiments, the number of the gate electrodes 130 isolated by the upper separation regions SS may be varied. The upper separation regions SS may include an upper isolation insulating layer 107.

Each of the channel structures CH may form a memory cell string, and may be spaced apart from each other while forming rows and columns on the first region A. The channel structures CH may form a grid pattern on the X-Y plane or may be in a zigzag pattern in one or more directions. The channel structures CH may have a columnar shape, and may have an inclined side surface having a width in one or more horizontal directions that decreases toward the second substrate 101 depending on an aspect ratio. In some example embodiments, dummy channels not substantially forming a memory cell string may be further on an end of the first region A and the second region B adjacent to the second region B.

As illustrated in the enlarged diagram in FIG. 1B, the channel layer 140 may be in the channel structures CH. In the channel structures CH, the channel layer 140 may be formed in an annular shape surrounding the channel insulating layer 150 therein. However, in example embodiments, the channel layer 140 may have a columnar shape such as a cylindrical shape or a prism shape without the channel insulating layer 150. The channel layer 140 may be connected to the first horizontal conductive layer 102 at a lower portion. The channel layer 140 may include a semiconductor material such as polycrystalline silicon or single crystal silicon. The channel structures CH on a linear line in the Y-direction between the first or second separation regions MS1 and MS2 and the upper separation region SS may be electrically isolated from each other by a second interconnection structure UI connected to channel pads 155.

In the channel structures CH, the channel pads 155 may be on the channel layer 140. The channel pads 155 may cover the upper surface of the channel insulating layer 150 and may be electrically connected to the channel layer 140. The channel pads 155 may include, for example, doped polycrystalline silicon.

Each of the channel structures CH may further include memory cells facing the gate electrodes 130, respectively. In some example embodiments, and with reference to FIG. 3, among the memory cells the second memory cells MC_U, the third memory cells MC_M, and the fourth memory cells MC_L that face the second to fourth gate electrodes 130M2, 130M3, and 130M4, respectively, may store an N number of bits of data, and the first and fifth memory cells MC_DU and MC_DL that face the first and fifth gate electrodes 130M1 and 130M5, respectively may store an M number of bits of data. Each of the second memory cells MC_U, the third memory cells MC_M, and the fourth memory cells MC_L may store the N bit data. Each of the first and fifth memory cells MC_DU and MC_DL may store the M bit data. N and M may be different natural numbers. Accordingly, the second memory cells MC_U, the third memory cells MC_M, and the fourth memory cells MC_L may be different from the first memory cells MC_DU and the fifth memory cells MC_DL.

For example, each of the second memory cells MC_U, the third memory cells MC_M, and the fourth memory cells MC_L may be a triple-level cell (TLC) storing three-bit data, each of the first memory cells MC_DU and the fifth memory cells MC_DL may be a multi-level cell (MLC) storing two-bit data. This may improve cell operating speed.

The gate dielectric layer 145 may be between the gate electrodes 130 and the channel layer 140. Although not specifically illustrated, the gate dielectric layer 145 may include a tunneling layer, a charge storage layer, and a blocking layer stacked in order from the channel layer 140. The tunneling layer may tunnel electric charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-κ dielectric material, or a combination thereof. In example embodiments, at least a portion of the gate dielectric layer 145 may extend in a horizontal direction along the gate electrodes 130.

The cell region insulating layer 190 may cover the second substrate 101, the gate electrodes 130 on the second substrate 101, and the peripheral region insulating layer 290. The cell region insulating layer 190 may include first and second cell region insulating layers 192 and 194, and each of the first and second cell region insulating layers 192 and 194 may also include a plurality of insulating layers. The cell region insulating layer 190 may be formed of an insulating material.

The upper protective layer 195 may be on the upper surface of the first upper interconnection lines 182 between the first and second cell region insulating layers 192 and 194. In example embodiments, the upper protective layer 195 may be on the upper surfaces of the second upper interconnection lines 184. The upper protective layer 195 may be provided to prevent contamination of the upper interconnection lines 180 therebelow due to a metal material. The upper protective layer 195 may be formed of an insulating material different from that of the cell region insulating layer 190, and may include, for example, silicon nitride.

The gate contacts 162 may be connected to the gate electrodes 130 in the second region B. The gate contacts 162 may extend through at least a portion of the first cell region insulating layer 192 and may be connected to each of the gate electrodes 130 exposed upwardly. The gate contacts 162 may include first to fifth gate contacts connected to the first to fifth gate electrodes 130M1, 130M2, 130M3, 130M4, and 130M5, respectively. In some example embodiments, a difference in levels between fourth gate contacts adjacent to each other among the fourth gate contacts may be greater than a difference in levels between third gate contacts adjacent to each other among the third gate contacts. The levels may be measured from a surface of the second substrate 101. A difference in levels between lower surfaces of the fourth gate contacts adjacent to each other among the fourth gate contacts may be greater than a difference in levels between lower surfaces of the third gate contacts adjacent to each other among the third gate contacts. A difference in levels between first and second gate contacts adjacent to each other among the first and second gate contacts may be greater than a difference in levels between third gate contacts adjacent to each other among the third gate contacts. A difference in levels between lower surfaces of the first and second gate contacts adjacent to each other among the first and second gate contacts may be greater than a difference in levels between lower surfaces of the third gate contacts adjacent to each other among the third gate contacts.

The substrate contact 164 may be connected to the second substrate 101 on an end of the second region B. The substrate contact 164 may extend through at least a portion of the first cell region insulating layer 192, may extend through the first and second horizontal conductive layers 102 and 104 exposed upwards, and may be connected to the second substrate 101. The substrate contact 164 may apply an electrical signal to, for example, a common source line including the second substrate 101.

The second interconnection structure UI may be an interconnection structure electrically connected to the gate electrodes 130 and the channel structures CH. The second interconnection structure UI may include upper contact plugs 170 having a column shape and upper interconnection lines 180 having a line shape. The upper contact plugs 170 may include first to third upper contact plugs 172, 174, and 176. The first upper contact plugs 172 may be on the channel pads 155 and the gate contacts 162, the second upper contact plugs 174 may be on the first upper contact plugs 172, and the third upper contact plugs 176 may be on the first upper interconnection lines 182. The upper interconnection lines 180 may include first and second upper interconnection lines 182 and 184. The first upper interconnection lines 182 may be on the second upper contact plugs 174, and the second upper interconnection lines 184 may be on the third upper contact plugs 176. The second interconnection structure UI may include a conductive material, such as, for example, tungsten (W), copper (Cu), aluminum (Al), or the like, and may further include a diffusion barrier layer. In example embodiments, the number of layers of the upper contact plugs 170 and the upper interconnection lines 180 included in the second interconnection structure UI and the arrangement thereof may be varied.

The through interconnection region TR may be a region including a through interconnection structure which may electrically connect the memory cell region CELL with the peripheral circuit region PERI. The through interconnection region TR may include a first through-via 165 extending in the vertical direction (Z-direction) through the second substrate 101 from an upper portion of the memory cell region CELL and an insulating region surrounding the first through-via 165. The insulating region may include sacrificial insulating layers 118, interlayer insulating layers 120 provided parallel to the sacrificial insulating layers 118, and a substrate insulating layer 105*i*. In example embodiments, the size, arrangement, and shape of the through interconnection region TR may be varied. In FIG. 1A, the through interconnection regions TR may be in the second region B, but the present disclosure is not limited thereto, and through interconnection regions TR may also be in the first region A with a predetermined distance therebetween. The through interconnection region TR may be spaced apart from the first and second separation regions MS1 and MS2. For example, the through interconnection region TR may be in a center of a pair of adjacent first separation regions MS1 in the Y-direction. With this arrangement, the sacrificial insulating layers 118 may remain in the through interconnection region TR.

The first through-via 165 may extend through a portion of the first cell region insulating layer 192, the insulating region, the lower protective layer 295, and the second peripheral region insulating layer 294 from an upper portion, and may extend perpendicularly to the upper surface of the second substrate 101. An upper end of the first through-via 165 may be connected to the second interconnection structure UI, and a lower end of the first through-via 165 may be connected to the first interconnection structure LI. In example embodiments, the number, arrangement, and shape of the first through-vias 165 in one through-interconnection region TR may be varied. The first through-via 165 may include a conductive material, such as, for example, a metal material such as tungsten (W), copper (Cu), or aluminum (Al).

The sacrificial insulating layers 118 may be at the same level as a level of the gate electrodes 130 and may have the same thickness as that of the gate electrodes 130, and may be provided such that side surfaces of the sacrificial insulating layers 118 may be in contact with the gate electrodes 130 on the boundary of the through interconnection region TR. In example embodiments, a barrier structure may be between the sacrificial insulating layers 118 and the gate electrodes 130. The sacrificial insulating layers 118 may be alternately stacked with the interlayer insulating layers 120 and may form the insulating region. The sacrificial insulating layers 118 may have a width in one or more horizontal directions that is the same as or different from that of the inner substrate insulating layers 105*i* therebelow. The sacrificial insulating layers 118 may be formed of an insulating material different from that of the interlayer insulating layers 120, and may include, for example, silicon oxide, silicon nitride, or silicon oxynitride.

The second through-via 167 may extend through the outer substrate insulating layer 105*o* in the outer region C and may extend to the peripheral circuit structure PERI. The second through-via 167 may connect the upper interconnection structure UI to the lower interconnection structure LI similarly to the first through-via 165 of the through interconnection region TR. The second through-via 167 may include a conductive material, such as, for example, a metal material such as tungsten (W), copper (Cu), or aluminum (Al).

The ground interconnection structure GI may be throughout the peripheral circuit region PERI and the memory cell region CELL, and may connect the first substrate 201 to the second substrate 101. The ground interconnection structure GI may perform a function of grounding the second substrate 101 during a process of manufacturing the semiconductor device 100. The ground interconnection structure GI may include lower contact plugs 270 and lower interconnection lines 280, which may be lower interconnection structures corresponding to the first interconnection structure LI, and may further include an upper via GV connected to the third lower interconnection line 286 in the uppermost portion among the lower interconnection lines 280.

The upper via GV may extend through the second peripheral region insulating layer 294 and the lower protective layer 295 and may be directly connected to the third lower interconnection line 286. The upper via GV may be integrated with the second substrate 101 of the memory cell region CELL. The upper via GV may be formed together with the second substrate 101 and may include the same material as that of the second substrate 101, and an interface with the second substrate 101 may not be present.

Figure 4A:
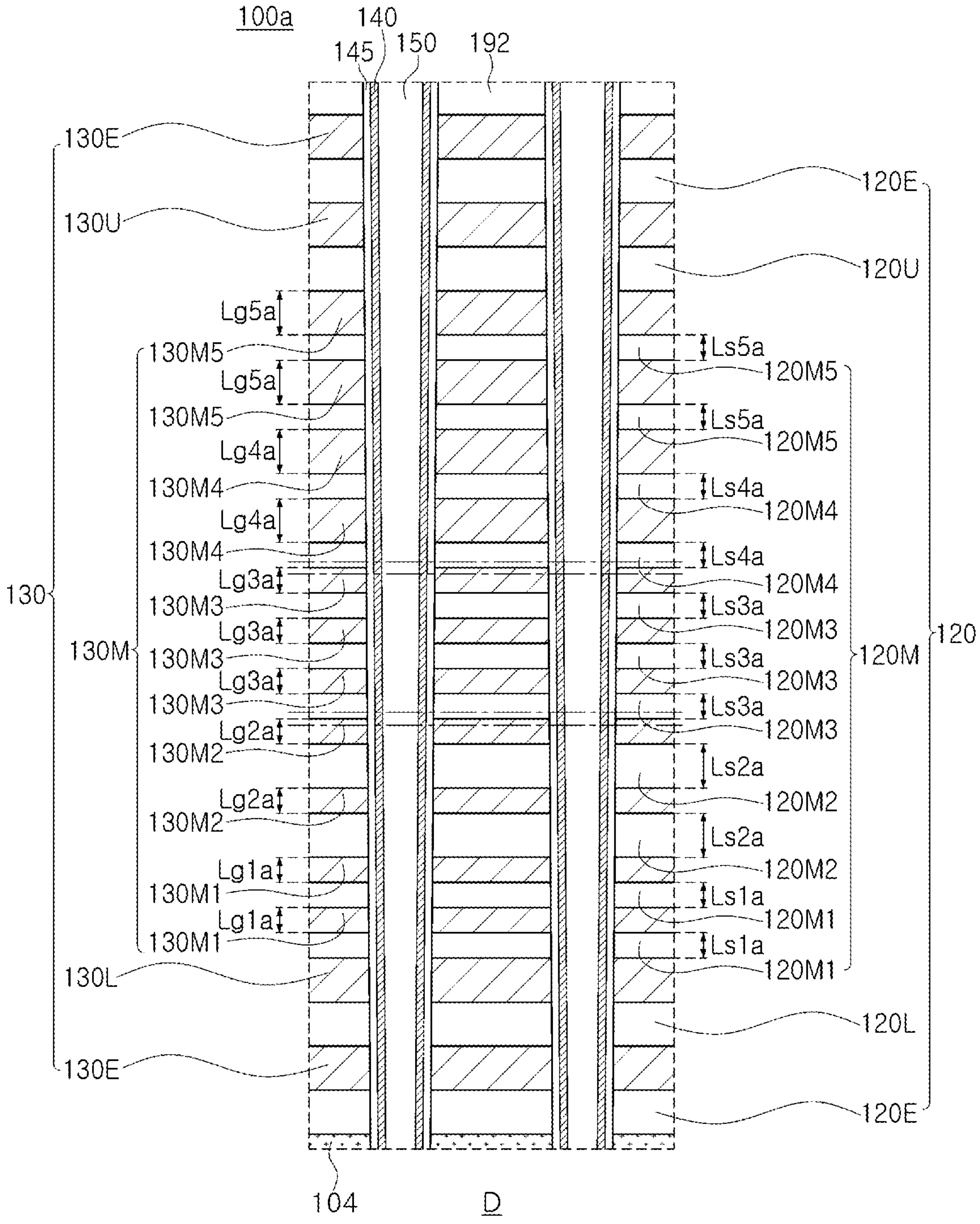
FIG. 4A is an enlarged diagram illustrating a portion of a semiconductor device according to some example embodiments.

FIG. 4A is an enlarged diagram illustrating a portion of a semiconductor device according to some example embodiments.

FIG. 4B is a table relating to a semiconductor device according to some example embodiments.

Referring to FIGS. 4A and 4B, and differently from the example embodiments discussed with reference to FIGS. 1A to 3, each of the fifth gate electrodes 130M5 may have a thickness greater than a thickness of the first, second, and third gate electrodes 130M1, 130M2, and 130M3. For example, each of the fifth gate electrodes 130M5 may have a thickness of about 1.005 times to about 1.1 times greater than that of each of the first, second, and third gate electrodes 130M1, 130M2, and 130M3. In this case, to lower a resistance value of each of the fifth gate electrodes 130M5, the thickness of each of the fifth gate electrodes 130M5 may be increased.

Each of the first interlayer insulating layers 120M1 may not have an increased thickness, and each of the first interlayer insulating layers 120M1 may have substantially the same thickness as that of each of the third to fifth interlayer insulating layers 120M3, 120M4, and 120M5. This may prevent the overall thickness of the first to fifth interlayer insulating layers 120M1, 120M2, 120M3, 120M4, and 120M5 from increasing excessively.

Figure 5A:
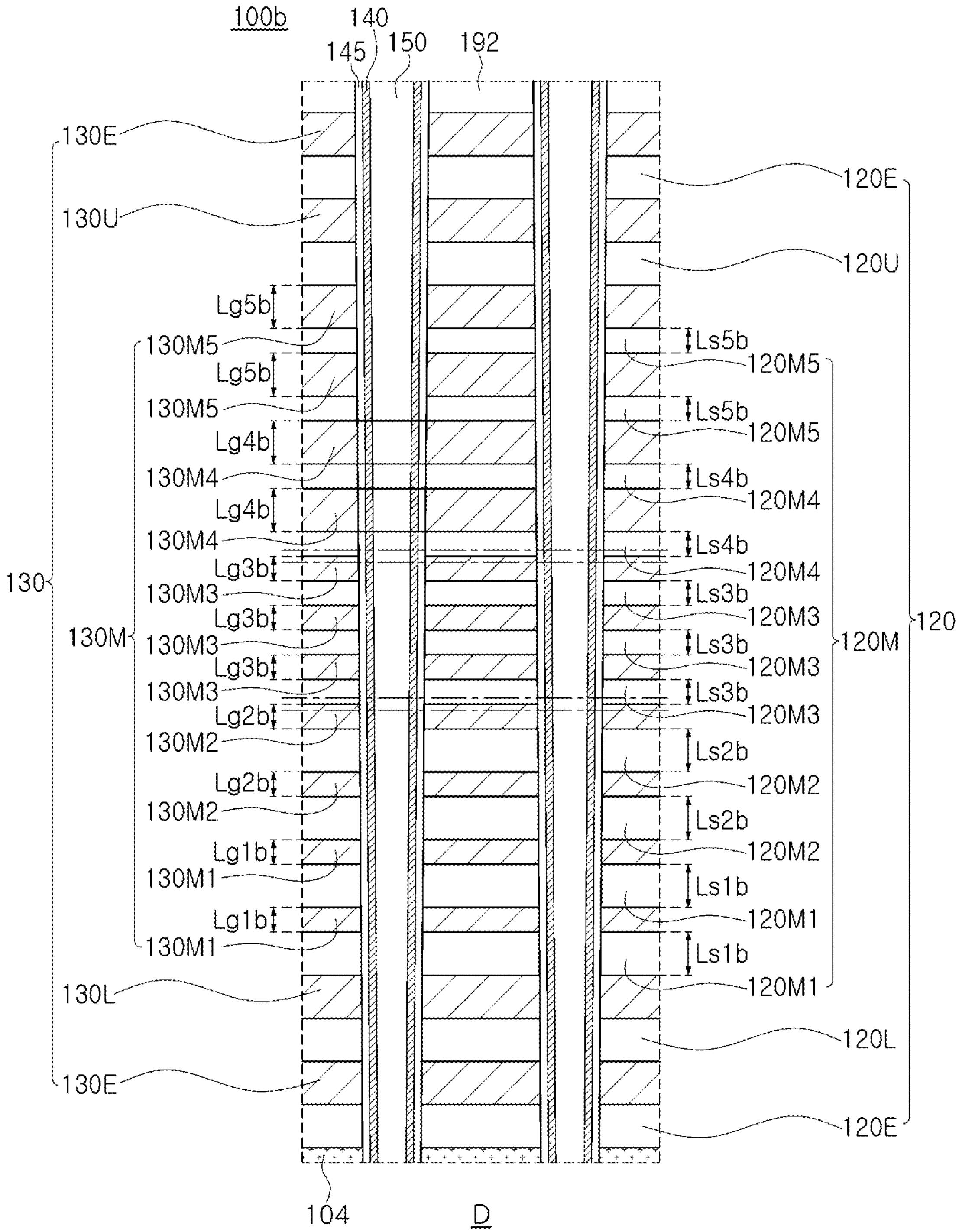
FIG. 5A is an enlarged diagram illustrating a portion of a semiconductor device according to some example embodiments.

FIG. 5A is an enlarged diagram illustrating a portion of a semiconductor device according to some example embodiments.

FIG. 5B is a table relating to a semiconductor device according to some example embodiments.

Referring to FIGS. 5A and 5B, differently from the example embodiments discussed with reference to FIGS. 1A to 3, each of the fifth gate electrodes 130M5 may have a thickness greater than that of the first, second, and third gate electrodes 130M1, 130M2, and 130M3. For example, and each of the fifth gate electrodes 130M5 may have a thickness of about 1.005 times to about 1.1 times greater than that of each of the first, second, and third gate electrodes 130M1, 130M2, and 130M3. In this case, the thickness of each of the fifth gate electrodes 130M5 may be increased to lower a resistance value of each of the fifth gate electrodes 130M5.

FIGS. 6A to 6G are cross-sectional diagrams illustrating a method of manufacturing a semiconductor device according to some example embodiments, illustrating regions corresponding to the region illustrated in FIG. 1A.

Figure 6A:
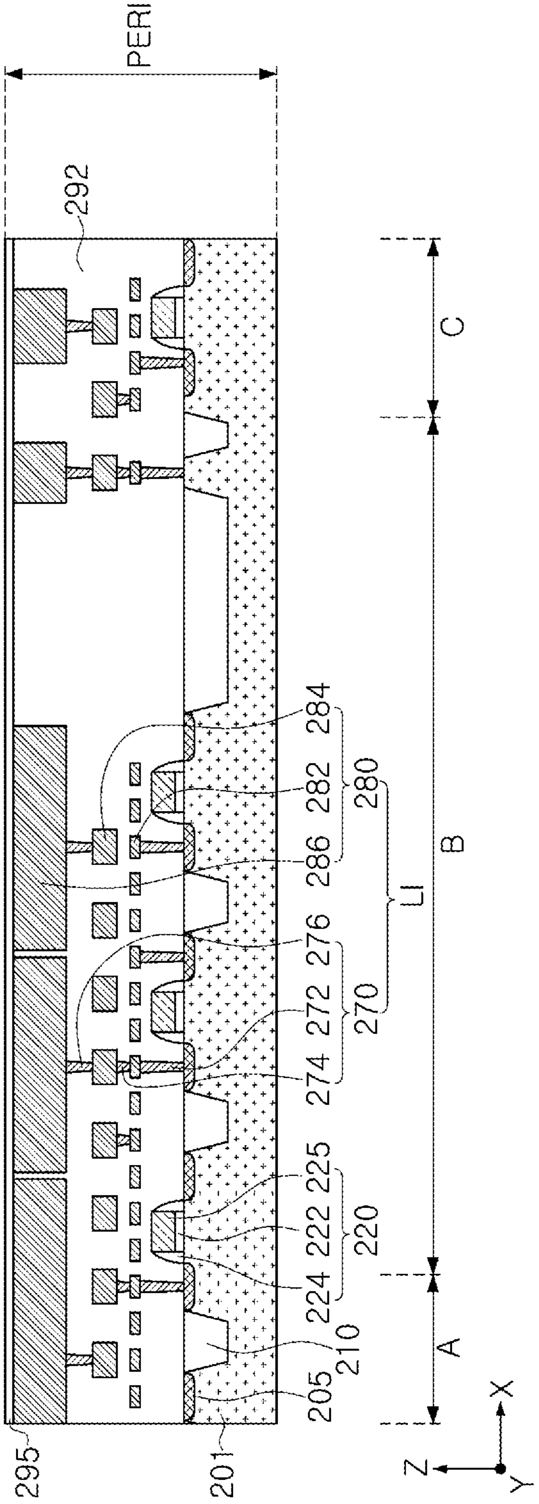
FIGS. 6A, 6B, 6C, 6D, 6E, 6F, and 6G are cross-sectional diagrams illustrating a method of manufacturing a semiconductor device according to some example embodiments.

Referring to FIG. 6A, the circuit devices 220 and the first interconnection structure LI may be formed on the first substrate 201.

First, the device isolation layers 210 may be formed in the first substrate 201, and the circuit gate dielectric layer 222 and the circuit gate electrode 225 may be formed in order on the first substrate 201. The device isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polycrystalline silicon or a metal silicide layer, but the present disclosure is not limited thereto. Thereafter, a spacer layer 224 and source/drain regions 205 may be formed on both sidewalls of the circuit gate dielectric layer 222 and the circuit gate electrode 225. In some example embodiments, the spacer layer 224 may include a plurality of layers. Thereafter, the source/drain regions 205 may be formed by performing an ion implantation process.

The lower contact plugs 270 of the first interconnection structure LI may be formed by partially forming the first peripheral region insulating layer 292, removing a portion thereof by etching, and filling a conductive material. The lower interconnection lines 280 may be formed by, for example, depositing a conductive material and patterning the material. When the first interconnection structure LI is formed, a lower interconnection structure forming a portion of the ground interconnection structure GI (see FIG. 1A) may be formed together. Accordingly, the lower interconnection structure may have the same stack structure as that of the first interconnection structure LI.

The first peripheral region insulating layer 292 may include a plurality of insulating layers. The first peripheral region insulating layer 292 may be partially formed in each process of forming the first interconnection structure LI. A lower protective layer 295 covering an upper surface of the third lower interconnection line 286 may be formed on the first peripheral region insulating layer 292.

Figure 6B:
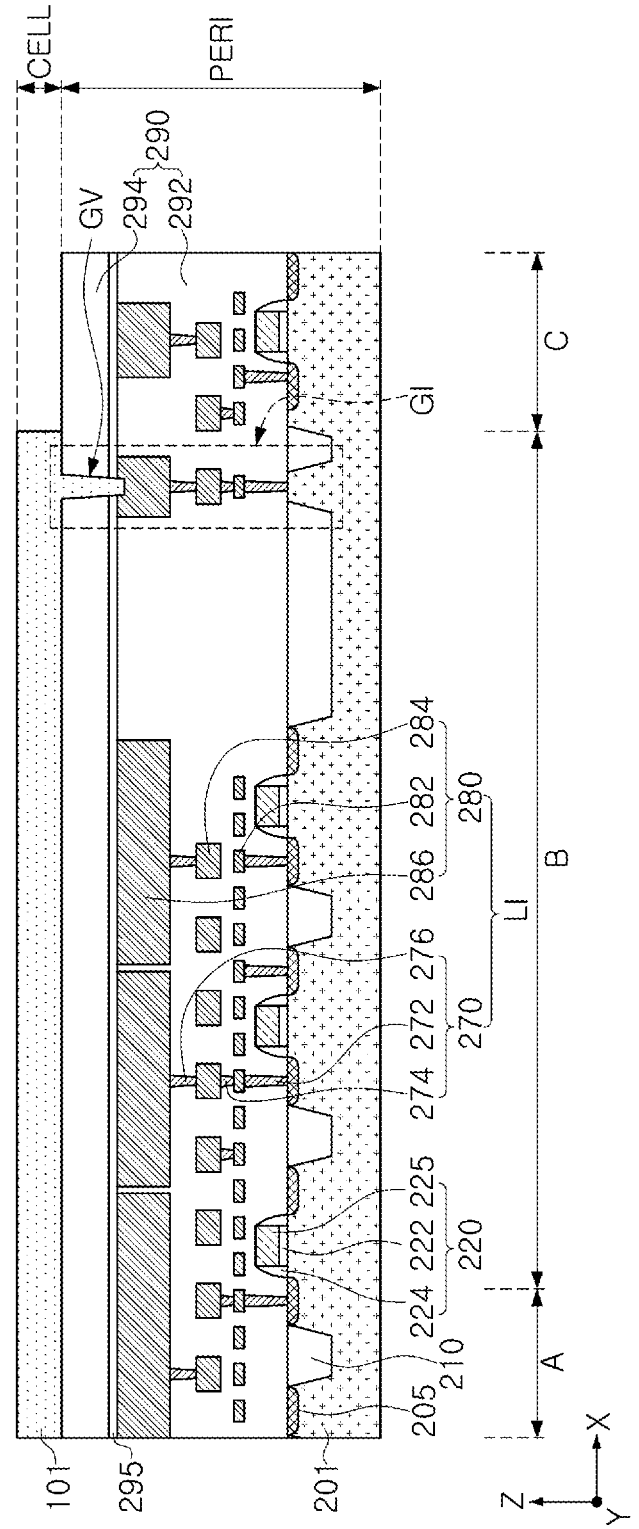

Referring to FIG. 6B, the second peripheral region insulating layer 294 may be formed on the lower protective layer 295, and the second substrate 101 of the memory cell region and the upper via GV of the ground interconnection structure GI may be formed on the peripheral circuit region PERI.

By forming the second peripheral region insulating layer 294, the entirety of the peripheral circuit region PERI may be formed.

A via hole may be formed by partially removing the second peripheral region insulating layer 294. The via hole may be a through-hole for forming an upper via GV (see FIG. 1A) of the ground interconnection structure GI. The via hole may be formed by removing the second peripheral region insulating layer 294 and the lower protective layer 295 using a mask layer such that third lower interconnection line 286 of the lower interconnection structure included in the ground interconnection structure GI may be exposed.

The second substrate 101 may be formed of, for example, polycrystalline silicon, and may be formed by a CVD process. When the second substrate 101 is formed, a material included in the second substrate 101 may fill the via hole and may form an upper via GV. Polycrystalline silicon forming the second substrate 101 may include impurities, such as, for example, N-type impurities. The second substrate 101 may be formed on the second peripheral region insulating layer 294 (e.g., the entire second peripheral region insulating layer 294), may be patterned, and may be removed from a partial region including the third region C of the memory cell region CELL. In the region in which the second substrate 101 is removed, the barrier layer 103 below the second substrate 101 may also be removed.

Figure 6C:
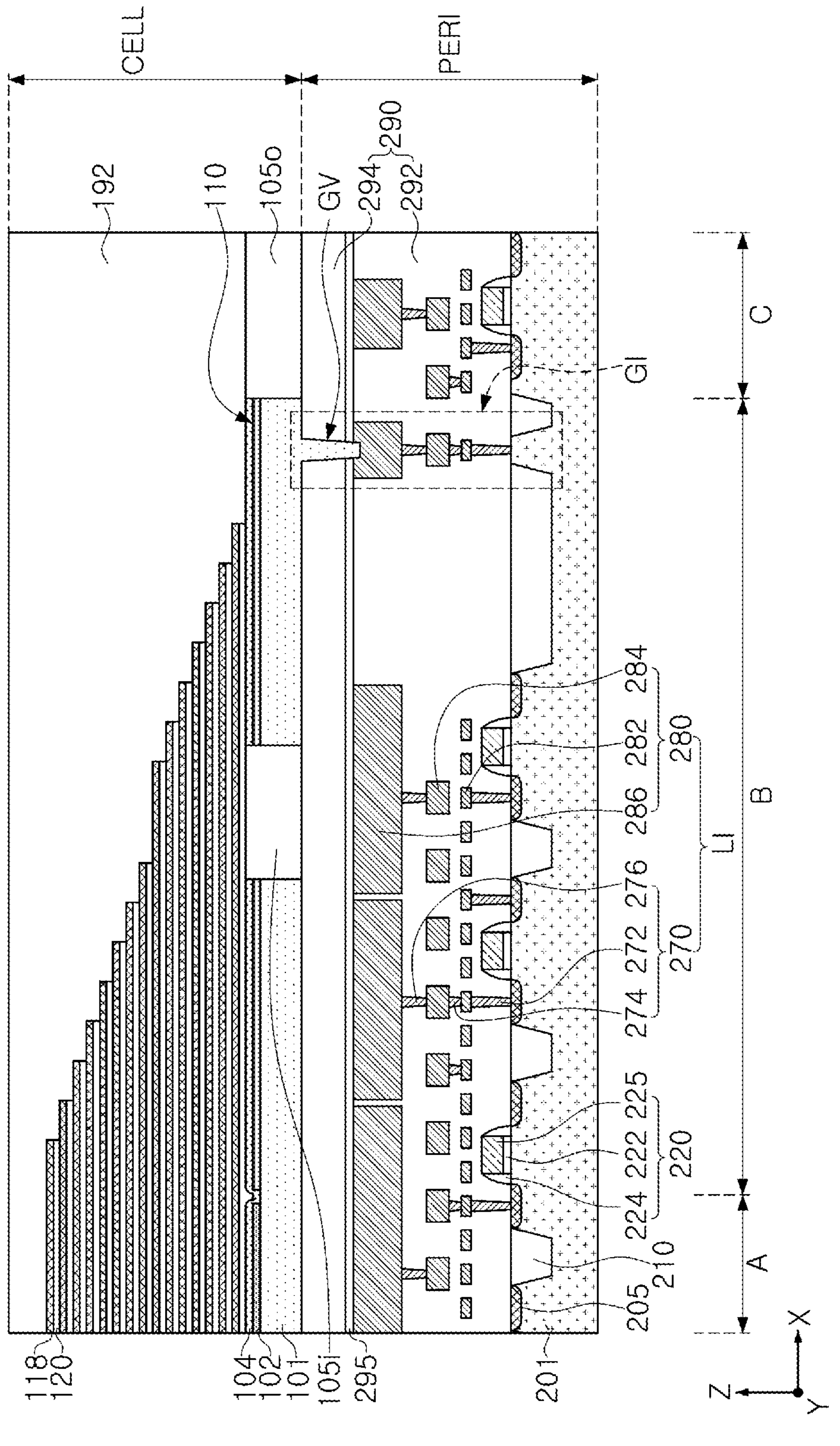

Referring to FIG. 6C, the horizontal insulating layer 110 and the second horizontal conductive layer 104 may be formed, the substrate insulating layers 105*i* and 105*o* may be formed, and the sacrificial insulating layers 118 and the interlayer insulating layers 120 may be alternately stacked.

The first and second horizontal insulating layers 111 and 112 included in the horizontal insulating layer 110 may be formed on the second substrate 101. The first and second horizontal insulating layers 111 and 112 may be stacked on the second substrate 101 such that the first horizontal insulating layers 111 may be above and below the second horizontal insulating layer 112. The first and second horizontal insulating layers 111 and 112 may include different materials. For example, the first horizontal insulating layers 111 may be formed of the same material as that of the interlayer insulating layers 120, and the second horizontal insulating layer 112 may be formed of the same material as that of the sacrificial insulating layers 118. The horizontal insulating layer 110 may be replaced with the first horizontal conductive layer 102 in FIG. 1A through a subsequent process. The horizontal insulating layer 110 may be removed by a patterning process in a portion of the regions.

The second horizontal conductive layer 104 may be formed on the first and second horizontal insulating layers 111 and 112, and may be in contact with the second substrate 101 in the region from which the horizontal insulating layer 110 is removed. Accordingly, the second horizontal conductive layer 104 may be bent along the ends of the horizontal insulating layer 110, may cover the ends, and may extend onto the second substrate 101.

The substrate insulating layers 105*i* and 105*o* may be formed by partially removing the first and second horizontal insulating layers 111 and 112, the second horizontal conductive layer 104, and the second substrate 101, and filling an insulating material therein. After filling the insulating material, a planarization process may be further performed using a chemical mechanical polishing (CMP) process. Accordingly, upper surfaces of the substrate insulating layers 105*i* and 105*o* may be substantially coplanar with the upper surfaces of the second horizontal conductive layer 104.

Thereafter, sacrificial insulating layers 118 and interlayer insulating layers 120 alternately stacked on the second horizontal conductive layer 104 may be formed. The sacrificial insulating layers 118 may be partially replaced with the gate electrodes 130 (see FIG. 2A) through a subsequent process. The sacrificial insulating layers 118 may be formed of a material different from that of the interlayer insulating layers 120, and may be formed of a material etched with etching selectivity with respect to the interlayer insulating layers 120 under specific etching conditions. For example, the interlayer insulating layers 120 may be formed of at least one of silicon oxide and silicon nitride, and the sacrificial insulating layers 118 may be formed of a material different from that of the interlayer insulating layers 120 selected from among silicon, silicon oxide, silicon carbide, and silicon nitride. In some example embodiments, the thicknesses of the interlayer insulating layers 120 may not be the same. The thicknesses of the interlayer insulating layers 120 and the sacrificial insulating layers 118 and the number of films included in the interlayer insulating layers 120 and the sacrificial insulating layers 118 may be varied from the example illustrated.

A photolithography process and an etching process may be repeatedly performed on the sacrificial insulating layers 118 using a mask layer such that the upper sacrificial insulating layers 118 may extend shorter than the lower sacrificial insulating layers 118 on the second region B. Accordingly, the sacrificial insulating layers 118 may form a step structure in a staircase shape in a predetermined unit.

Thereafter, a first cell region insulating layer 192 covering the stack structure of the sacrificial insulating layers 118 and the interlayer insulating layers 120 may be formed.

Figure 6D:
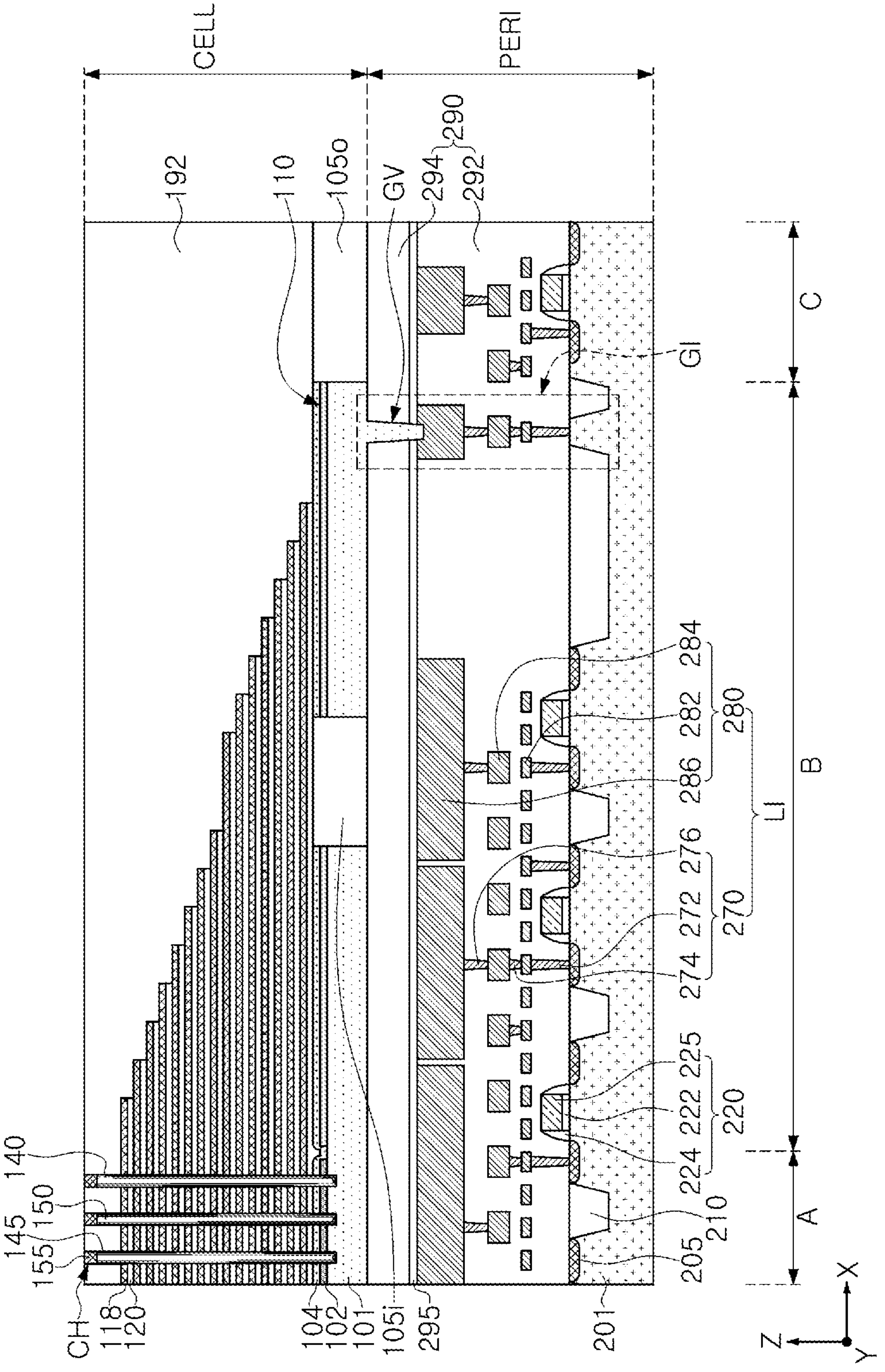

Referring to FIG. 6D, channel structures CH extending through the stack structure of the sacrificial insulating layers 118 and the interlayer insulating layers 120 may be formed.

First, upper separation regions SS (see FIG. 1B) may be formed by removing a portion of the sacrificial insulating layers 118 and the interlayer insulating layers 120. The upper separation regions SS may be formed by exposing a region in which the upper separation regions SS are to be formed, removing a predetermined number of the sacrificial insulating layers 118 and the interlayer insulating layers 120 from an upper portion, and depositing an insulating material.

The channel structures CH may be formed by anisotropically etching the sacrificial insulating layers 118 and the interlayer insulating layers 120, and may be formed by forming hole-shaped channel holes and filling the holes. Due to the height of the stack structure, sidewalls of the channel structures CH may not be perpendicular to the upper surface of the second substrate 101. The channel structures CH may be formed to be recessed into a portion of the second substrate 101. Thereafter, at least a portion of the gate dielectric layer 145, the channel layer 140, the channel insulating layer 150, and the channel pads 155 may be formed in order in the channel structures CH.

The gate dielectric layer 145 may be formed to have a uniform thickness using an ALD or CVD process. In this process, the entirety or portion of the gate dielectric layer 145 may be formed, and a portion extending perpendicularly to the second substrate 101 along the channel structures CH may be formed in this process. The channel layer 140 may be formed on the gate dielectric layer 145 in the channel structures CH. The channel insulating layer 150 may be formed to fill the channel structures CH, and may be an insulating material. However, in some example embodiments, the space between the channel layers 140 may be filled with a conductive material instead of the channel insulating layer 150. The channel pad 155 may be formed of a conductive material, such as, for example, polycrystalline silicon.

Figure 6E:
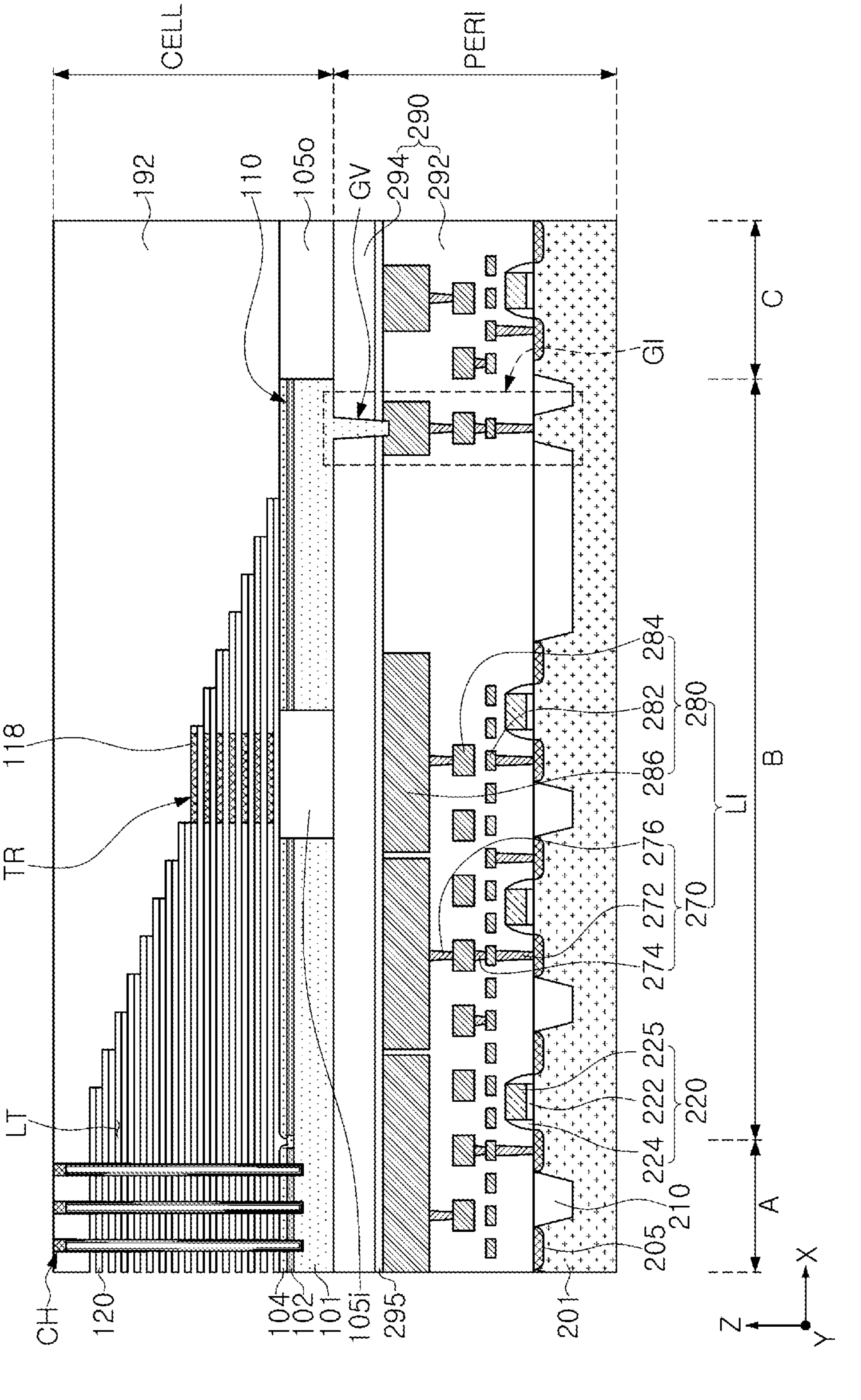

Referring to FIG. 6E, tunnel portions LT may be formed by forming openings extending through the stack structure of the sacrificial insulating layers 118 and the interlayer insulating layers 120 in regions corresponding to the first and second separation regions MS1 and MS2 (see FIG. 1B), and removing a portion of the sacrificial insulating layers 118 through the openings.

First, sacrificial spacer layers may be formed in the openings, the second horizontal insulating layers 112 may be selectively removed, and the first horizontal insulating layers 111 may be removed. The first and second horizontal insulating layers 111 and 112 may be removed by, for example, a wet etching process. In the process of removing the first horizontal insulating layers 111, a portion of the gate dielectric layer 145 may be removed from a region where the gate dielectric layer 145 is exposed by the removal of the second horizontal insulating layers 112. The first horizontal conductive layer 102 may be formed by depositing a conductive material in the region in which the first and second horizontal insulating layers 111 and 112 are removed, and the sacrificial spacer layers may be removed from the openings.

Thereafter, the sacrificial insulating layers 118 may be removed from the external side of the through interconnection region TR (see FIG. 1A). The sacrificial insulating layers 118 may remain in the through interconnection region TR and may form an insulating region of the through interconnection region TR together with the interlayer insulating layers 120. The sacrificial insulating layers 118 may be selectively removed with respect to the interlayer insulating layers 120 using, for example, wet etching. Accordingly, a plurality of tunnel portions LT may be formed between the interlayer insulating layers 120.

The region in which the through interconnection region TR is formed may be a region in which the sacrificial insulating layers 118 remain because the region is spaced apart from the openings and an etchant may not reach the region. Accordingly, the through interconnection region TR may be formed in the center of the first and second separation regions MS1 and MS2 between the adjacent first and second separation regions MS1 and MS2.

Figure 6F:
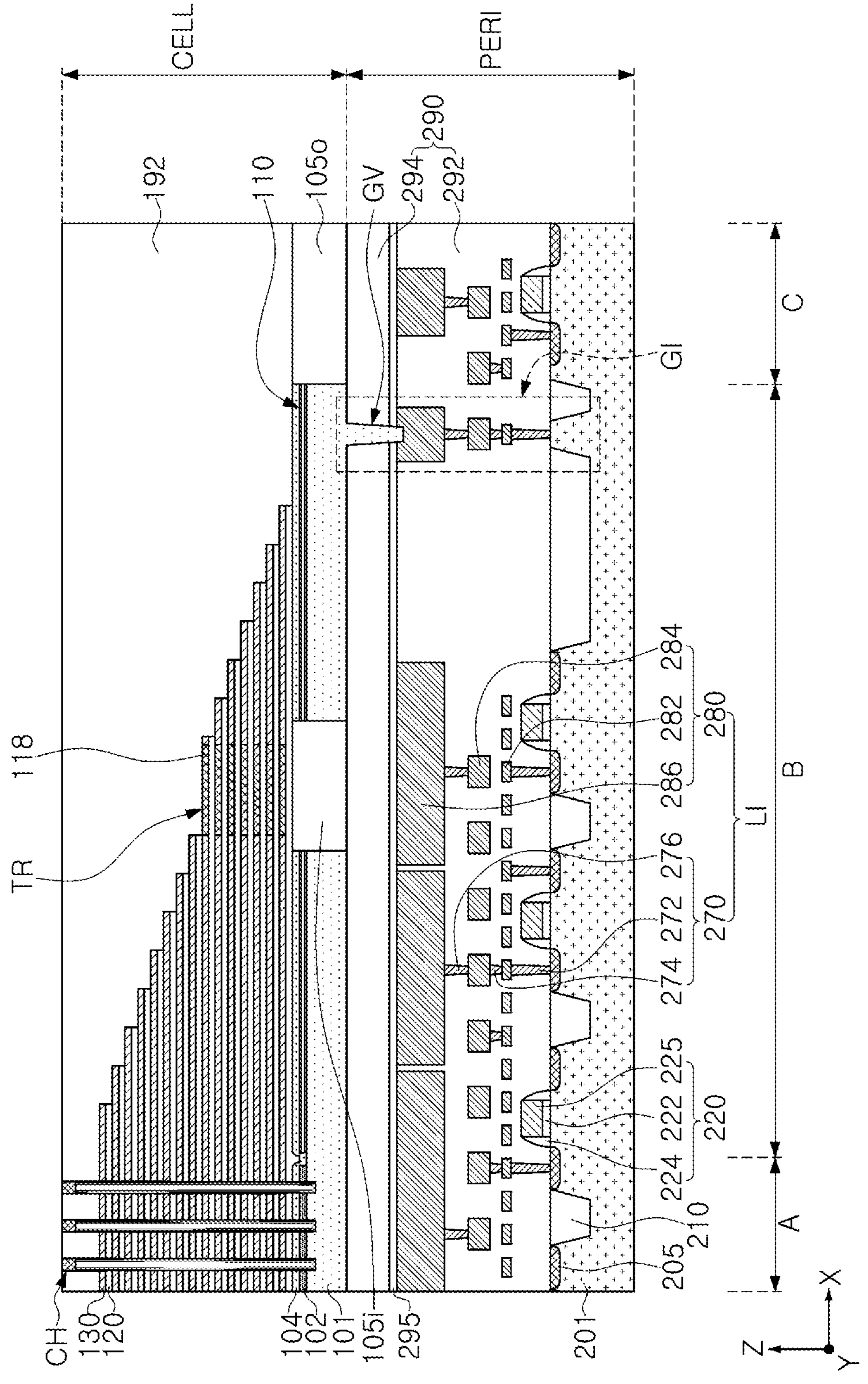

Referring to FIG. 6F, the gate electrodes 130 may be formed by filling the tunnel portions LT from which the sacrificial insulating layers 118 are partially removed with a conductive material.

The conductive material forming the gate electrodes 130 may fill the tunnel portions LT. Side surfaces of the gate electrodes 130 may be in contact with side surfaces of the sacrificial insulating layers 118 of the through interconnection region TR. The conductive material may include a metal, polycrystalline silicon, or a metal silicide material. After forming the gate electrodes 130, the conductive material deposited in the openings may be removed through an additional process, and an insulating material may fill the region, thereby forming the isolation insulating layer 108 (see FIG. 1B).

Figure 6G:
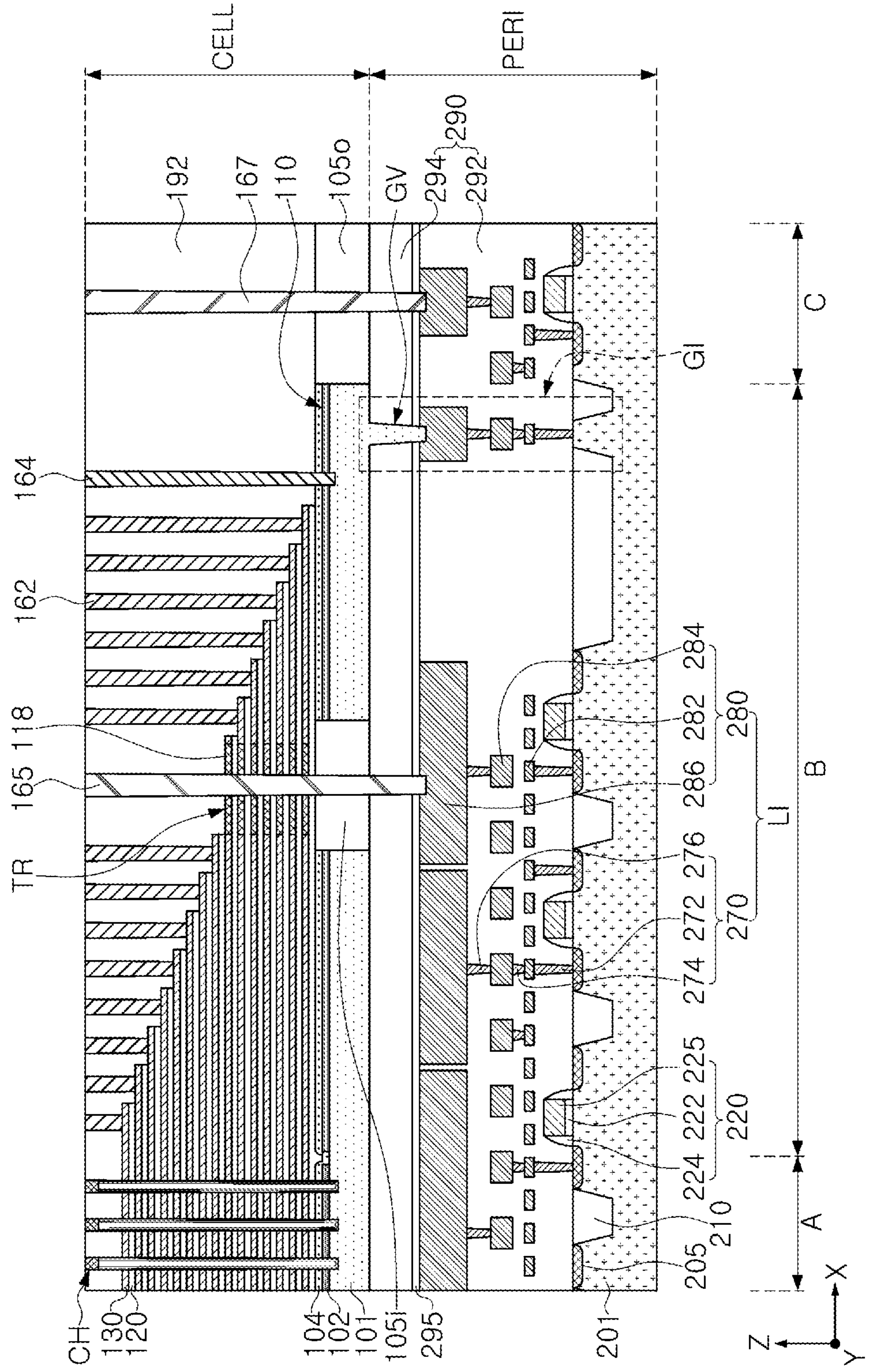

Referring to FIG. 6G, gate contacts 162 extending through the first cell region insulating layer 192, a substrate contact 164, and first and second through-vias 165 and 167 may be formed.

The gate contacts 162 may be formed to be connected to the gate electrodes 130 in the second region B, and the substrate contact 164 may be formed to be connected to the second substrate 101 on an end of the second region B. The first through-via 165 may be formed to be connected to the first interconnection structure LI of the peripheral circuit region PERI in the through interconnection region TR, and the second through-via 167 may be formed to be connected to the first interconnection structure LI in the peripheral circuit region PERI in the third region C.

The gate contacts 162, the substrate contact 164, and the first and second through-vias 165 and 167 may be formed to have different depths, but may be formed by simultaneously forming contact holes using an etch stop layer and filling the contact hole with a conductive material. However, in some example embodiments, a portion of the gate contacts 162, the substrate contact 164, and the first and second through-vias 165 and 167 may be formed in different processes.

Thereafter, referring back to FIG. 1A, a second cell region insulating layer 194, an upper protective layer 195, and an upper interconnection structure UI may be formed.

The upper contact plugs 170 of the upper interconnection structure UI may be formed by partially forming the cell region insulating layer 190, removing a portion thereof by etching, and filling the conductive material. The upper interconnection lines 180 may be formed by, for example, depositing a conductive material and patterning the material.

Accordingly, the semiconductor device 100 in FIGS. 1A to 3 may be manufactured.

Figure 7:
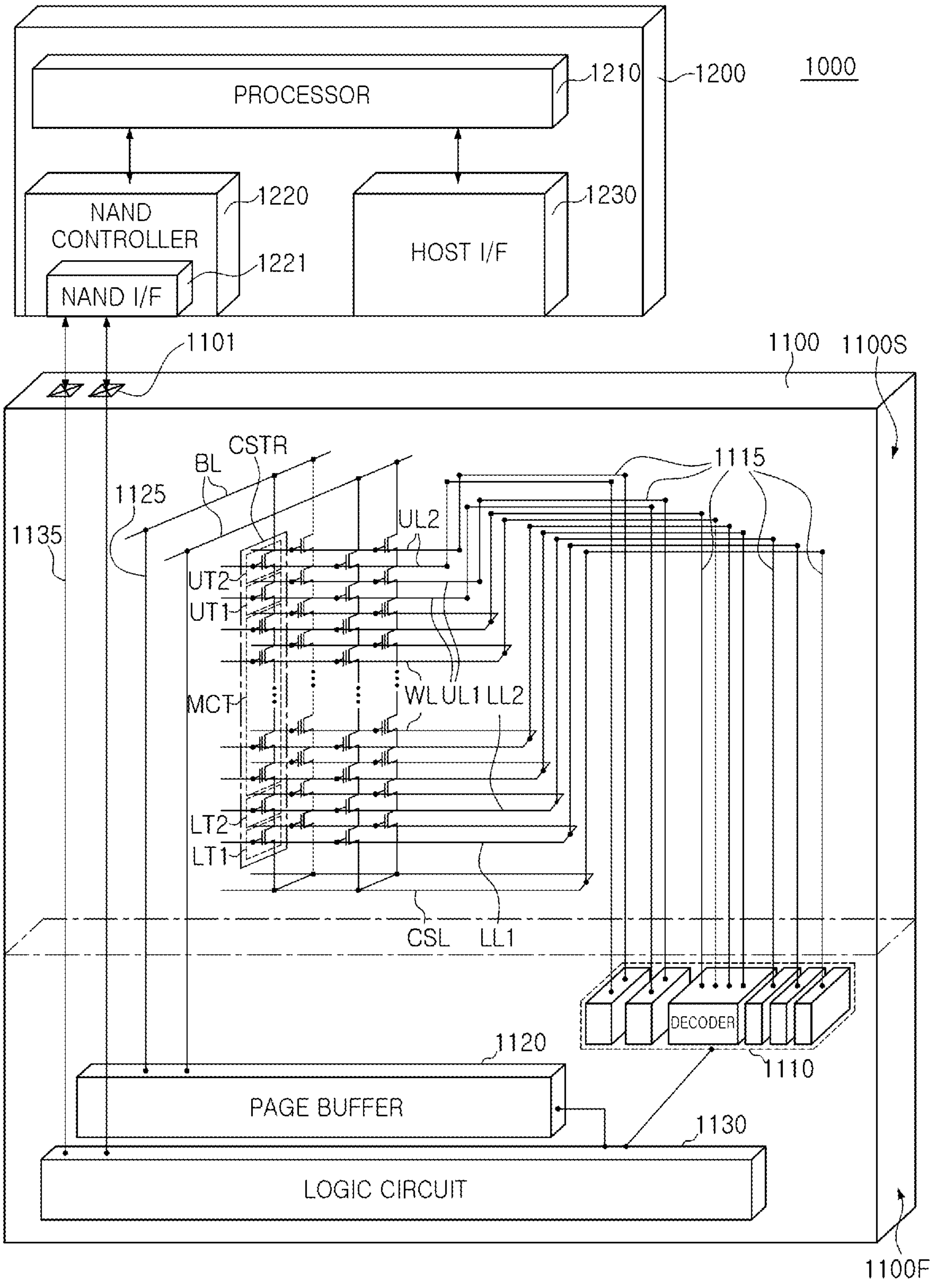
FIG. 7 is a diagram illustrating an electronic system including a semiconductor device according to some example embodiments.

FIG. 7 is a perspective diagram illustrating an electronic system including a semiconductor device according to an example embodiment.

Referring to FIG. 7, an electronic system 1000 may include a semiconductor device 1100 and a controller 1200 electrically connected to the semiconductor device 1100. The electronic system 1000 may be implemented as a storage device including one or a plurality of semiconductor devices 1100, or as an electronic device including a storage device. For example, the electronic system 1000 may be implemented as a solid state drive device (SSD) including one or a plurality of semiconductor devices 1100, a universal serial bus (USB), a computing system, a medical device, or a communication device.

The semiconductor device 1100 may be implemented as a non-volatile memory device, such as, for example, the NAND flash memory device described above with reference to FIGS. 1 to 6G. The semiconductor device 1100 may include a first structure 1100F and a second structure 1100S on the first structure 1100F. In example embodiments, the first structure 1100F may be on the side of the second structure 1100S. The first structure 1100F may be implemented as a peripheral circuit structure including a decoder circuit 1110, a page buffer 1120, and a logic circuit 1130. The second structure 1100S may be implemented as a memory cell structure including a bit line BL, a common source line CSL, word lines WL, first and second gate upper lines UL1 and UL2, first and second gate lower lines LL1 and LL2 and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors LT1 and LT2 and the number of upper transistors UT1 and UT2 may be varied in example embodiments.

In some example embodiments, the upper transistors UT1 and UT2 may include a string select transistor, and the lower transistors LT1 and LT2 may include a ground select transistor. The gate lower lines LL1 and LL2 may be configured as gate electrodes of the lower transistors LT1 and LT2, respectively. The word lines WL may be configured as gate electrodes of the memory cell transistors MCT, and the gate upper lines UL1 and UL2 may be configured as gate electrodes of the upper transistors UT1 and UT2, respectively.

In some example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT2 may be used in an erase operation for erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection wires 1115 extending from the first structure 1100F to the second structure 1100S. The bit lines BL may be electrically connected to the page buffer 1120 through second connection interconnections 1125 extending from the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may further include an input/output pad 1101. The semiconductor device 1100 may communicate with the controller 1200 through the input/output pad 1101 electrically connected to the logic circuit 1130. The input/output pad 1101 may be electrically connected to the logic circuit 1130 through an input/output connection line 1135 extending from the first structure 1100F to the second structure 1100S.

The controller 1200 may include a processor 1210, a NAND controller 1220, and a host interface 1230. In some example embodiments, the electronic system 1000 may include a plurality of semiconductor devices 1100, and in this case, the controller 1200 may control the plurality of semiconductor devices 1100.

The processor 1210 may control overall operation of the electronic system 1000 including the controller 1200. The processor 1210 may operate according to a predetermined firmware, and may access the semiconductor device 1100 by controlling the NAND controller 1220. The NAND controller 1220 may include a controller interface 1221 processing communication with the semiconductor device 1100. Through the controller interface 1221, a control command for controlling the semiconductor device 1100, data to be written to the memory cell transistors MCT of the semiconductor device 1100, and data to be read from the memory cell transistors MCT of the semiconductor device 1100 may be transmitted. The host interface 1230 may provide a communication function between the electronic system 1000 and an external host. When a control command from an external host is received through the host interface 1230, the processor 1210 may control the semiconductor device 1100 in response to the control command.

Figure 8:
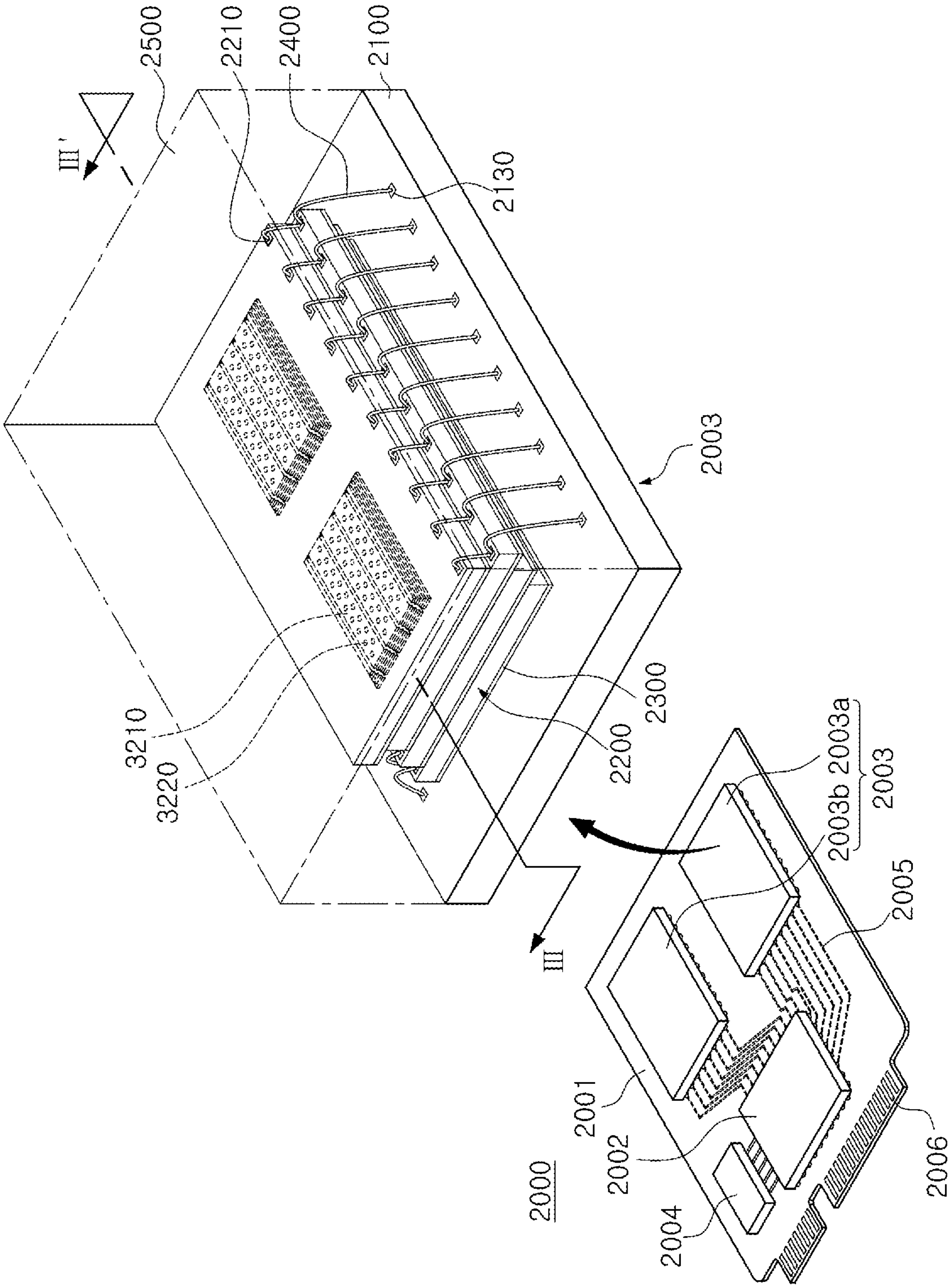
FIG. 8 is a perspective diagram illustrating an electronic system including a semiconductor device according to some example embodiments.

FIG. 8 is a perspective diagram illustrating an electronic system including a semiconductor device according to some example embodiments.

Referring to FIG. 8, an electronic system 2000 in some example embodiments may include a main board 2001, a controller 2002 mounted on the main board 2001, one or more semiconductor packages 2003, and a DRAM 2004. The semiconductor package 2003 and the DRAM 2004 may be connected to the controller 2002 by interconnection patterns 2005 formed on the main board 2001.

The main board 2001 may include a connector 2006 including a plurality of pins coupled to an external host. The number and arrangement of the plurality of pins in the connector 2006 may vary depending on a communication interface between the electronic system 2000 and the external host. In some example embodiments, the electronic system 2000 may communicate with an external host according to one of interfaces from among universal serial bus (USB), peripheral component interconnect express (PCI-Express), serial advanced technology attachment (SATA), M-Phy for universal flash storage (UFS). In some example embodiments, the electronic system 2000 may operate by power supplied from an external host through the connector 2006. The electronic system 2000 may further include a power management integrated circuit (PMIC) for distributing power supplied from the external host to the controller 2002 and the semiconductor package 2003.

The controller 2002 may write data to or read data from the semiconductor package 2003, and may improve an operating speed of the electronic system 2000.

The DRAM 2004 may be configured as a buffer memory, which may alleviate a difference in speeds between the semiconductor package 2003, which is a data storage space, and an external host. The DRAM 2004 included in the electronic system 2000 may operate as a cache memory, and may provide a space for temporarily storing data in a control operation for the semiconductor package 2003. When the electronic system 2000 may include the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be configured as a semiconductor package including a plurality of semiconductor chips 2200. Each of the first and second semiconductor packages 2003*a* and 2003*b* may include a package substrate 2100, semiconductor chips 2200 on the package substrate 2100, adhesive layers 2300 on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each semiconductor chip 2200 may include an input/output pad 2210. The input/output pad 2210 may correspond to the input/output pad 1101 in FIG. 7. Each of the semiconductor chips 2200 may include gate stack structures 3210 and channel structures 3220. Each of the semiconductor chips 2200 may include the semiconductor device described above with reference to FIGS. 1 to 6G.

In some example embodiments, the connection structure 2400 may be configured as a bonding wire electrically connecting the input/output pad 2210 to the upper package pads 2130. Accordingly, in each of the first and second semiconductor packages 2003*a* and 2003*b*, the semiconductor chips 2200 may be electrically connected to each other by a bonding wire method, and may be electrically connected to the package upper pads 2130 of the package substrate 2100. In example embodiments, in each of the first and second semiconductor packages 2003*a* and 2003*b*, the semiconductor chips 2200 may be electrically connected to each other by a connection structure including a through-electrode (TSV) instead of the connection structure 2400 of a bonding wire method.

In some example embodiments, the controller 2002 and the semiconductor chips 2200 may be included in a single package. In an example embodiment, the controller 2002 and the semiconductor chips 2200 may be mounted on a separate interposer substrate different from the main board 2001, and the controller 2002 and the semiconductor chips 2200 may be connected to each other interconnection formed on the interposer substrate.

Figure 9:
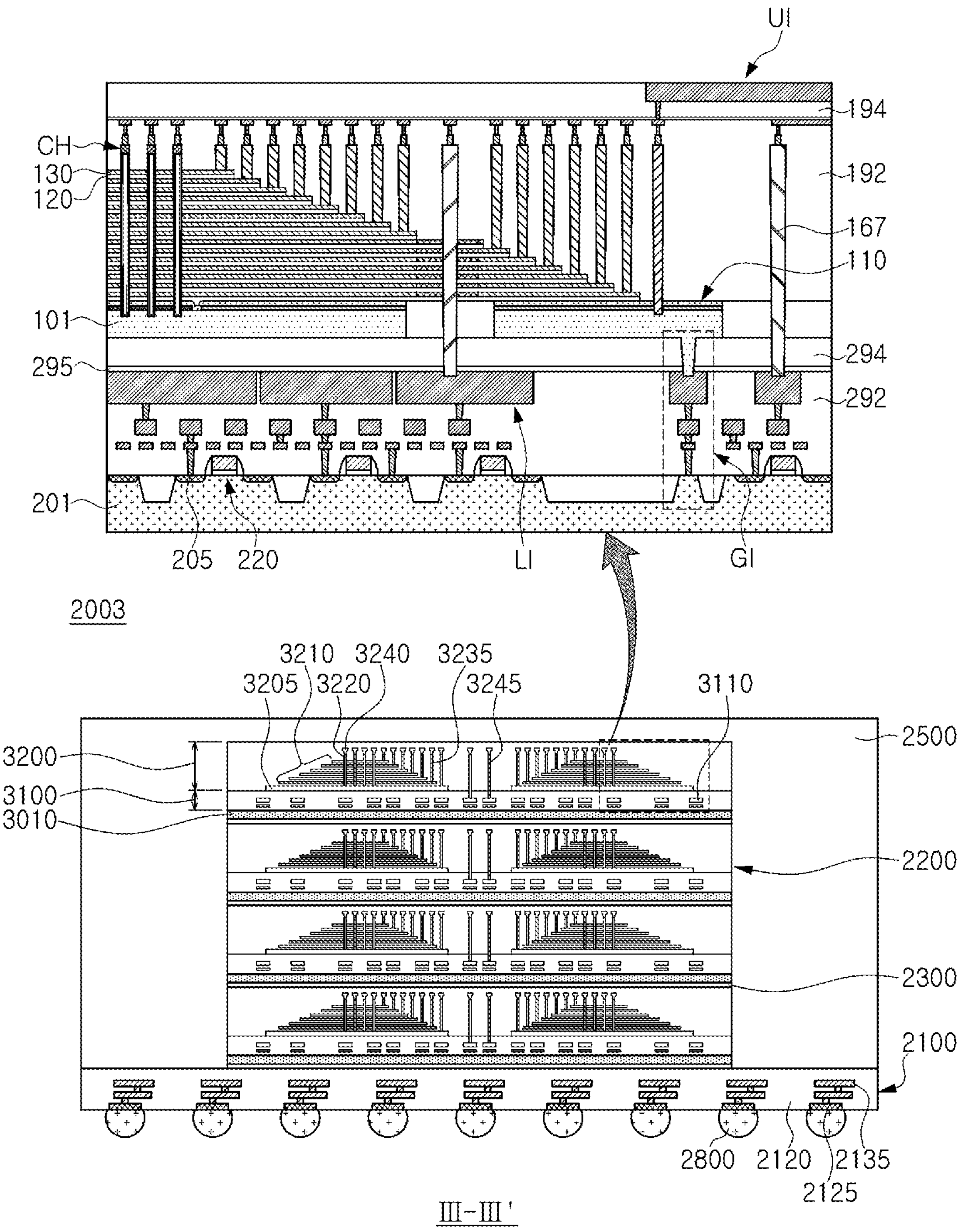
FIG. 9 is a cross-sectional diagram illustrating a semiconductor package according to some example embodiments.

FIG. 9 is a cross-sectional diagram illustrating a semiconductor package according to some example embodiments, illustrating an example embodiment of the semiconductor package 2003 in FIG. 8 taken along line III-III'.

Referring to FIG. 9, in the semiconductor package 2003, the package substrate 2100 may be a printed circuit board. The package substrate 2100 may include a package substrate body portion 2120, package upper pads 2130 (see FIG. 8) on the upper surface of the package substrate body portion 2120, package lower pads 2125 on or exposed through the lower surface of the package substrate body portion 2120, and internal interconnections 2135 electrically connecting the package upper pads 2130 to the package lower pads 2125 in the package substrate body portion 2120. The package upper pads 2130 may be electrically connected to the connection structures 2400. The lower pads 2125 may be connected to the interconnection patterns 2005 of the main board 2001 of the electronic system 2000 as illustrated in FIG. 8 through conductive connection portions 2800.

Each of the semiconductor chips 2200 may include a semiconductor substrate 3010 and a first structure 3100 and a second structure 3200 stacked in order on the semiconductor substrate 3010. The first structure 3100 may include a peripheral circuit region including peripheral interconnections 3110. The second structure 3200 may include a common source line 3205, a gate stack structure 3210 on the common source line 3205, memory channel structures 3220 and separation regions penetrating through the gate stack structure 3210, and gate contact plugs 3235 electrically connected to word lines WL (see FIG. 7) of the gate stack structure 3210.

Each of the semiconductor chips 2200 may include a through interconnection 3245 electrically connected to the peripheral interconnections 3110 of the first structure 3100 and extending into the second structure 3200. The through interconnection 3245 may be on the external side of the gate stack structure 3210, and may extend through the gate stack structure 3210. Each of the semiconductor chips 2200 may further include an input/output pad 2210 (see FIG. 8) electrically connected to the peripheral interconnections 3110 of the first structure 3100.

According to the aforementioned example embodiments, by configuring the gate electrodes to have different thicknesses and the interlayer insulating layers to have different thicknesses, semiconductor devices having improved electrical properties and reliability and electronic systems including the same may be provided.

While the example embodiments have been illustrated and described above, it will be configured as apparent to those skilled in the art that modifications and variations could be made without departing from the scope of the present disclosure as defined by the appended claims.

What is claimed is:

1. A semiconductor device, comprising:

a peripheral circuit region including a first substrate, circuit devices on the first substrate, and a first interconnection structure electrically connected to the circuit devices; and a memory cell region that overlaps the peripheral circuit region, wherein the memory cell region includes:

a second substrate;

a stack of gate electrodes and interlayer insulating layers alternately stacked in a vertical direction perpendicular to an upper surface of the second substrate; and a channel structure that extends through the stack and includes a channel layer, wherein the gate electrodes include first gate electrodes, second gate electrodes on the first gate electrodes, third gate electrodes on the second gate electrodes, fourth gate electrodes on the third gate electrodes, and fifth gate electrodes on the fourth gate electrodes, wherein the interlayer insulating layers include first interlayer insulating layers, second interlayer insulating layers on the first interlayer insulating layers, third interlayer insulating layers on the second interlayer insulating layers, fourth interlayer insulating layers on the third interlayer insulating layers, and fifth interlayer insulating layers on the fourth interlayer insulating layers, wherein each of the fourth gate electrodes has a first thickness that is greater than a second thickness of each of the third gate electrodes, wherein each of the fifth gate electrodes has the same thickness as the second thickness of each of the third gate electrodes, and wherein each of the second interlayer insulating layers has a third thickness that is greater than a fourth thickness of each of the third interlayer insulating layers.

2. The semiconductor device of claim 1, wherein each of the fourth gate electrodes has the first thickness that is 1.005 times to 1.1 times greater than the second thickness of each of the third gate electrodes, and wherein each of the second interlayer insulating layers has the third thickness that is 1.005 times to 1.1 times greater than the fourth thickness of each of the third interlayer insulating layers.

3. The semiconductor device of claim 1, wherein each of the first and second gate electrodes has the same thickness as the second thickness of each of the third gate electrodes and the fifth gate electrodes.

4. The semiconductor device of claim 1, wherein each of the first interlayer insulating layers has a fifth thickness that is greater than the fourth thickness of each of the third interlayer insulating layers.

5. The semiconductor device of claim 1, wherein each of the fifth gate electrodes has a sixth thickness that is greater than the second thickness of each of the third gate electrodes.

6. The semiconductor device of claim 1, wherein each of the first interlayer insulating layers has a fifth thickness that is greater than the fourth thickness of each of the third interlayer insulating layers, and wherein each of the fifth gate electrodes has a sixth thickness that is greater than the second thickness of each of the third gate electrodes.

7. The semiconductor device of claim 1, wherein the channel structure further includes memory cells that face the gate electrodes, respectively, wherein the memory cells include first memory cells and second memory cells that are different from the first memory cells, wherein the first memory cells face the second to fourth gate electrodes, respectively, wherein the second memory cells face the first and fifth gate electrodes, respectively, wherein each of the first memory cells store an N-bit data, wherein each of the second memory cells store an M-bit data, and wherein N and M are different natural numbers.

8. The semiconductor device of claim 7, wherein each of the first memory cells is a triple level cell (TLC), and wherein each of the second memory cells is a multi-level cell (MLC) different from the triple level cell (TLC).

9. The semiconductor device of claim 1, wherein the gate electrodes further include a string selection gate electrode on the fifth gate electrodes, and wherein the string selection gate electrode has a thickness that is greater than the second thickness of each of the third gate electrodes.

10. The semiconductor device of claim 1, wherein the gate electrodes further include a ground selection gate electrode below the first gate electrodes, and wherein the ground selection gate electrode has a thickness that is greater than the second thickness of each of the third gate electrodes.

11. The semiconductor device of claim 1, wherein the gate electrodes further include an erase gate electrode on the fifth gate electrodes, and wherein the erase gate electrode has a thickness that is greater than the second thickness of each of the third gate electrodes.

12. The semiconductor device of claim 1, wherein the memory cell region further includes first to fifth gate contacts that are electrically connected to the first to fifth gate electrodes, respectively.

13. The semiconductor device of claim 12, wherein a difference in distances from a surface of the second substrate of lower surfaces of fourth gate contacts adjacent to each other is greater than a difference in distances from the surface of the second substrate of lower surfaces of third gate contacts adjacent to each other.

14. The semiconductor device of claim 12, wherein a difference in distances from a surface of the second substrate of lower surfaces of second gate contacts adjacent to each other is greater than a difference in distances from the surface of the second substrate of lower surfaces of third gate contacts adjacent to each other among the third gate contacts.

15. The semiconductor device of claim 1, wherein the first gate electrodes and the first interlayer insulating layers are repeatedly and alternately stacked in the vertical direction, wherein the second gate electrodes and the second interlayer insulating layers are repeatedly and alternately stacked in the vertical direction, wherein the third gate electrodes and the third interlayer insulating layers are repeatedly and alternately stacked in the vertical direction, wherein the fourth gate electrodes and the fourth interlayer insulating layers are repeatedly and alternately stacked in the vertical direction, and wherein the fifth gate electrodes and the fifth interlayer insulating layers are repeatedly and alternately stacked in the vertical direction.

16. A semiconductor device, comprising:

a stack structure including gate electrodes and interlayer insulating layers repeatedly and alternately stacked in a vertical direction; and a channel structure that extends through the stack structure, wherein the gate electrodes include first gate electrodes, second gate electrodes on the first gate electrodes, and third gate electrodes on the second gate electrodes, wherein each of the first gate electrodes has a first thickness, wherein each of the second gate electrodes has a second thickness that is greater than the first thickness, wherein the interlayer insulating layers include first interlayer insulating layers, second interlayer insulating layers on the first interlayer insulating layers, and third interlayer insulating layers on the second interlayer insulating layers, wherein each of the third interlayer insulating layers has a fourth thickness, wherein each of the second interlayer insulating layers has a fifth thickness that is greater than the fourth thickness, and wherein each of the first interlayer insulating layers has a sixth thickness greater than the fourth thickness.

17. The semiconductor device of claim 16, wherein the first gate electrodes and the first interlayer insulating layers are repeatedly and alternately stacked in the vertical direction, wherein the second gate electrodes and the second interlayer insulating layers are repeatedly and alternately stacked in the vertical direction, and wherein the third gate electrodes and the third interlayer insulating layers are repeatedly and alternately stacked in the vertical direction.

18. An electronic system, comprising:

a semiconductor device, wherein the semiconductor device includes:

a peripheral circuit region including a first substrate, circuit devices on the first substrate, and a first interconnection structure electrically connected to the circuit devices; and a memory cell region that overlaps the peripheral circuit region;

a set of input/output pads electrically connected to the circuit devices; and a controller electrically connected to the semiconductor device through an input/output pad of the set of input/output pads and controlling the semiconductor device, wherein the memory cell region includes:

a second substrate;

gate electrodes stacked and spaced apart from each other in a first direction perpendicular to an upper surface of the second substrate;

interlayer insulating layers alternately stacked with the gate electrodes; and a channel structure that extends through the gate electrodes, the channel structure extending perpendicularly to the second substrate and including a channel layer, wherein the gate electrodes include first gate electrodes, second gate electrodes on the first gate electrodes, third gate electrodes on the second gate electrodes, fourth gate electrodes on the third gate electrodes, and fifth gate electrodes on the fourth gate electrodes, wherein the interlayer insulating layers include first interlayer insulating layers, second interlayer insulating layers on the first interlayer insulating layers, third interlayer insulating layers on the second interlayer insulating layers, fourth interlayer insulating layers on the third interlayer insulating layers, and fifth interlayer insulating layers on the fourth interlayer insulating layers, wherein each of the fourth gate electrodes has a first thickness that is greater than a second thickness of each of the third gate electrodes, wherein each of the fifth gate electrodes has the same thickness as the second thickness of each of the third gate electrodes, and wherein each of the second interlayer insulating layers has a third thickness that is greater than a fourth thickness of each of the third interlayer insulating layers.

19. The electronic system of claim 18, wherein each of the first and second electrodes has the same thickness as the second thickness of each of the third gate electrodes and the fifth gate electrodes, and wherein each of the first interlayer insulating layers has a fifth thickness that is greater than the fourth thickness of each of the third interlayer insulating layers.

* * * * *